(12) United States Patent
Nakano et al.

(10) Patent No.: US 7,656,036 B2
(45) Date of Patent: Feb. 2, 2010

(54) LINE COMPONENT AND SEMICONDUCTOR CIRCUIT USING LINE COMPONENT

(75) Inventors: Takashi Nakano, Tokyo (JP); Hirokazu Tohya, Tokyo (JP)

(73) Assignee: NEC Corporation, Tokyo (JP)

( * ) Notice: Subject to any disclaimer, the term of this patent is extended or adjusted under 35 U.S.C. 154(b) by 358 days.

(21) Appl. No.: 10/545,448

(22) PCT Filed: Feb. 13, 2004

(86) PCT No.: PCT/JP2004/001556
§ 371 (c)(1),
(2), (4) Date: Aug. 15, 2005

(87) PCT Pub. No.: WO2004/073066
PCT Pub. Date: Aug. 26, 2004

(65) Prior Publication Data
US 2006/0145309 A1 Jul. 6, 2006

(30) Foreign Application Priority Data
Feb. 14, 2003 (JP) .............................. 2003-037508

(51) Int. Cl.
*H01L 29/40* (2006.01)

(52) U.S. Cl. ..................... 257/758; 257/664; 257/759; 257/760; 257/E23.153; 257/E23.144

(58) Field of Classification Search ............... 257/664, 257/758, 759, 760, E23.153, E23.144
See application file for complete search history.

(56) References Cited

U.S. PATENT DOCUMENTS

| | | | |
|---|---|---|---|
| 3,512,052 A | 5/1970 | MacIver et al. | |
| 3,769,096 A | 10/1973 | Ashkin | |
| 3,955,098 A | 5/1976 | Kawamoto | |
| 4,302,648 A | 11/1981 | Sado et al. | |
| 4,442,019 A | 4/1984 | Marks | |
| 4,865,197 A | 9/1989 | Craig | |
| 4,926,052 A | 5/1990 | Hatayama | |
| 5,134,539 A * | 7/1992 | Tuckerman et al. | 361/311 |
| 5,173,835 A | 12/1992 | Cornett et al. | |
| 5,206,525 A | 4/1993 | Yamamoto et al. | |
| 5,598,029 A | 1/1997 | Suzuki | |
| 6,437,426 B1 | 8/2002 | Yoshida | |
| 6,444,564 B1 * | 9/2002 | Raeder | 438/618 |
| 6,674,138 B1 * | 1/2004 | Halliyal et al. | 257/411 |
| 2002/0018911 A1 | 2/2002 | Bernlus et al. | |
| 2002/0022284 A1 | 2/2002 | Heeger | |
| 2002/0025391 A1 | 2/2002 | Angelopoulos | |
| 2002/0053320 A1 | 5/2002 | Duthaler | |
| 2002/0056839 A1 | 5/2002 | Joo et al. | |
| 2002/0068392 A1 | 6/2002 | Lee et al. | |
| 2002/0130042 A1 | 9/2002 | Moerman et al. | |

(Continued)

FOREIGN PATENT DOCUMENTS

CN 1284835 2/2001

(Continued)

*Primary Examiner*—Wael Fahmy
*Assistant Examiner*—Marc Armand
(74) *Attorney, Agent, or Firm*—Young & Thompson

(57) ABSTRACT

A semiconductor circuit in which low impedance characteristics required for a decoupling circuit are ensured up to a band of several hundreds of MHz or above in the situation where digital circuits are rushing into GHz age, and a semiconductor circuit exhibiting low impedance characteristics even in a band of several hundreds of MHz or above. A line element comprising a power supply line and a ground line or a ground plane arranged oppositely through a dielectric, characterized in that a dielectric covering the line element is provided.

12 Claims, 12 Drawing Sheets

U.S. PATENT DOCUMENTS

| | | |
|---|---|---|
| 2002/0149112 A1 | 10/2002 | Houston |
| 2002/0155661 A1* | 10/2002 | Massingill et al. .......... 438/244 |
| 2002/0170897 A1 | 11/2002 | Hall |
| 2002/0195644 A1 | 12/2002 | Dodabalapur et al. |
| 2003/0059987 A1 | 3/2003 | Sirringhaus et al. |
| 2003/0112576 A1 | 6/2003 | Brewer et al. |
| 2004/0002176 A1 | 1/2004 | Xu |
| 2004/0013982 A1 | 1/2004 | Jacobson et al. |
| 2004/0026689 A1 | 2/2004 | Bernds et al. |
| 2004/0084670 A1 | 5/2004 | Tripsas et al. |
| 2004/0211329 A1 | 10/2004 | Funahata et al. |

FOREIGN PATENT DOCUMENTS

| | | |
|---|---|---|
| DE | 694 18 122 | 9/1993 |
| DE | 100 39 392 | 3/2001 |
| DE | 101 33 443 | 3/2002 |
| EP | 0 644 594 | 3/1995 |
| EP | 1 024 536 | 8/2000 |
| JP | 7-86513 | 3/1995 |
| JP | 10-270643 | 10/1998 |
| JP | 2000-216343 | 8/2000 |
| JP | 2001-53449 | 2/2001 |
| JP | 2001-338836 | 12/2001 |
| JP | 2002-16470 | 1/2002 |
| JP | 2002-26272 | 1/2002 |
| KR | 2002-0006456 | 1/2002 |
| TW | 495894 | 7/2002 |
| TW | 499793 | 8/2002 |

* cited by examiner

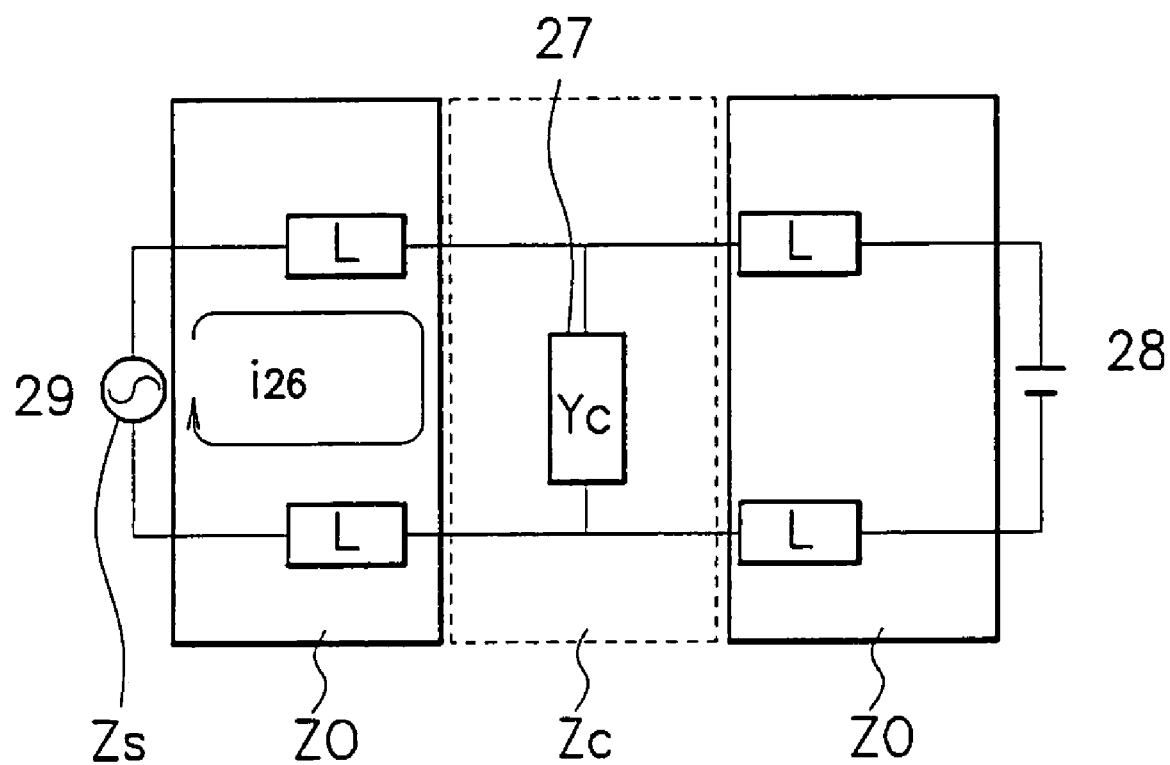
F I G. 1

FIG. 5
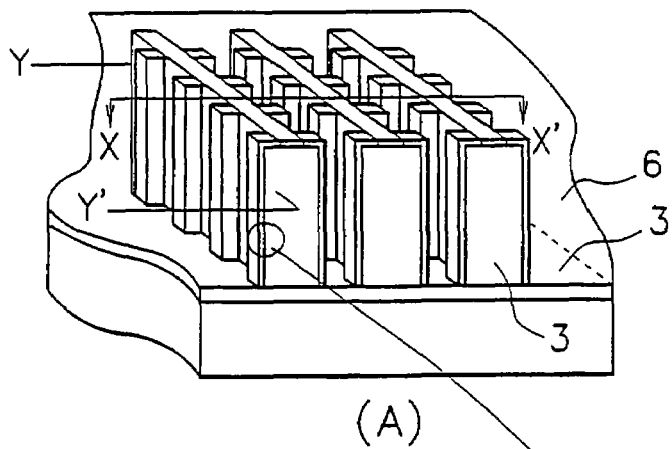
(A)
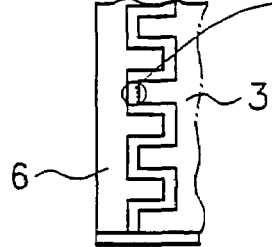
SECTIONAL VIEW ALONG LINE Y-Y'
(TRANSMISSION DIRECTION)
(B)
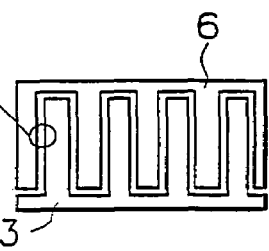
SECTIONAL VIEW ALONG LINE X-X'
(C)
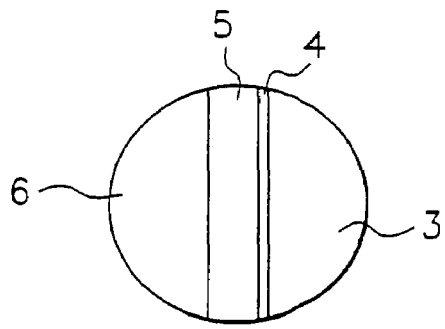
ENLARGED VIEW OF PART A
(D)

FIG. 11
(A)
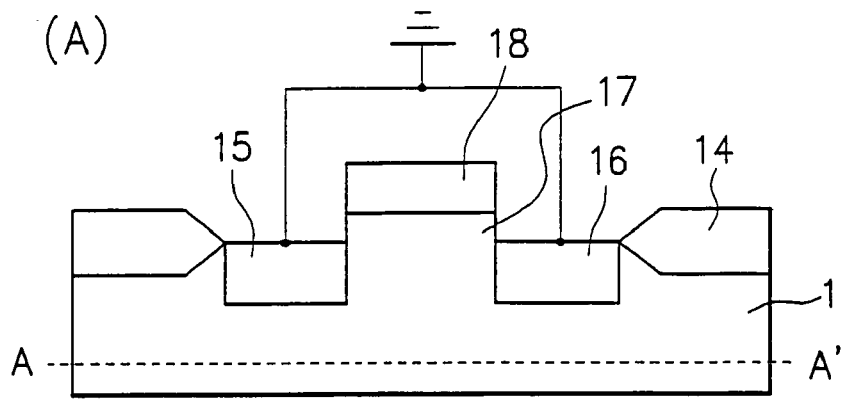
(B)
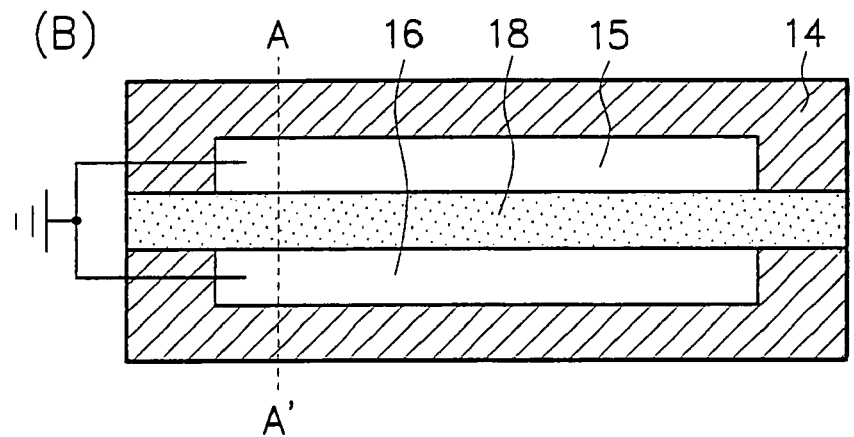
(C)
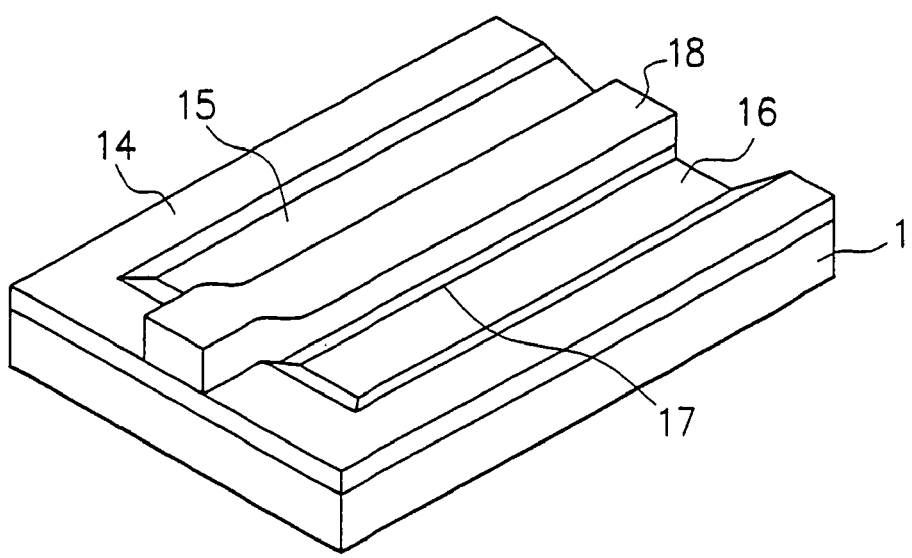

FIG. 12
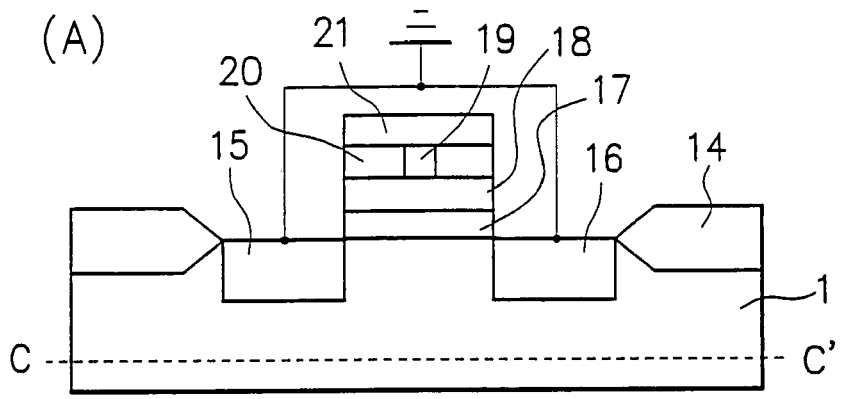
(A)
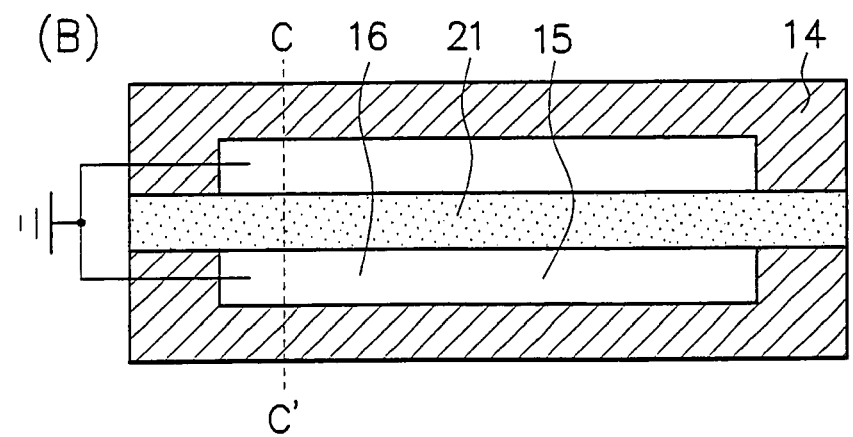
(B)
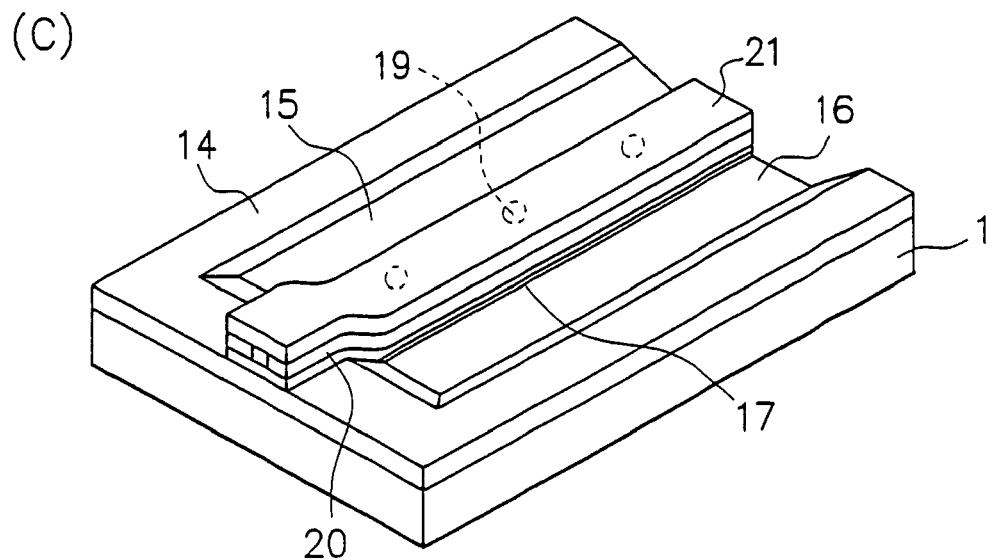
(C)

LINE COMPONENT AND SEMICONDUCTOR CIRCUIT USING LINE COMPONENT

TECHNICAL FIELD

The present invention relates to a semiconductor circuit and, more particularly, to a low-impedance line component having good electrical properties in a high-frequency band (not less than 10 MHz) and a semiconductor circuit in which this line component is used.

BACKGROUND ART

High-frequency electromagnetic waves are generated in connection with the switching action of semiconductor devices that constitute an LSI (large-scale integrated circuit) or an IC (integrated circuit), and part of the generated high-frequency electromagnetic waves leaks to a power supply distribution circuit of a printed circuit board via a power supply interconnection, a package, etc. When high-frequency electromagnetic waves are inductively coupled to a signal interconnection and the like within an LSI, a package and a substrate of a printed circuit board in the process of their propagation in the power supply interconnection, high-frequency electromagnetic waves leak from signal cables and equipment. Also, when the surge impedance of a power supply interconnection as viewed from switching components within an LSI is large, high-frequency electromagnetic waves generated in the switching components within the LSI cause interference in a signal interconnection, thereby generating signal voltage strains. Also, these high-frequency electromagnetic waves induce variations in the power supply voltage of the switching components. In order to suppress such electromagnetic interference, it is effective to insert a power supply decoupling circuit in which the insertion position and decoupling characteristics are considered so that the electromagnetic interference with the power supply interconnection from the LSI to the printed wiring board becomes minimized.

Conventionally, in semiconductor devices, as described in the Japanese Patent Laid-Open No. 10-2706643, decoupling has been performed by adding capacitors, which are handled as lumped components because of the small component size relative to a wavelength corresponding to the working frequency of a circuit.

When capacitors are used, it is necessary to consider also the series inductance components of the connection wiring part, and in this case, decoupling capacitors exhibit inductance characteristics at frequencies of not less than the series resonance frequency of capacitance and inductance, with the result that the higher the frequency, the more impedance will increase, thereby leading to the deterioration of decoupling characteristics.

As a measure against this phenomenon, there has been adopted a technique by which capacitors are disposed in a divided manner within an LSI or an IC, a package and a printed wiring board. However, also in this case, it is impossible to ignore the inductance of an interconnection which connects capacitors and a power supply distribution line together and hence in bands in which the working frequency is not less than several hundreds of megahertz, there has been a limit to changing the impedance of a decoupling circuit from inductance characteristics to capacitive characteristics.

DISCLOSURE OF THE INVENTION

Against the background that the working frequencies of digital circuits have entered a GHz age, ensuring low impedance characteristics necessary for decoupling circuits up to not less than several hundreds of megahertz is required to suppress electromagnetic interference and to improve signal quality. For this reason, the present invention has as its object the provision of a semiconductor circuit which has low impedance characteristics even in bands of not less than several hundreds of megahertz.

In the first aspect of the present invention, there is provided a line component in which a power supply interconnection and a ground interconnection or a ground surface are disposed in an opposed relation via dielectric. This line component is characterized in that a covering of an insulator which covers the line component is provided.

In the second aspect of the present invention, there is provided a line component comprising at least a first dielectric formed in a substantially constant thickness on a semiconductor substrate or a conductor layer and a first conductor formed on the dielectric. The first dielectric is formed by specifying the length of the first dielectric to a prescribed length in the traveling direction of a high-frequency wave and a covering of an insulator which covers the line component is provided.

In the third aspect of the present invention, there is provided the line component in the second aspect which is characterized in that an uneven portion is formed at least on one of interfaces between the semiconductor substrate or the conductor layer, and the first dielectric, and between the first dielectric and the first conductor.

In the fourth aspect of the present invention, there is provided the line component in the second or third aspect which is characterized in that the first conductor is further formed in film shape and that a second dielectric is formed in film shape between the conductor and the covering.

In the fifth aspect of the present invention, there is provided the line component in the second or third aspect which is characterized in that the first conductor is further formed in film shape and that a second conductor is provided via the second dielectric formed between the first conductor and the covering.

In the sixth aspect of the present invention, there is provided a line component in which at least one surface of a top surface, a bottom surface and side surfaces of a first conductor is covered with a third dielectric. This line component is characterized in that the line component is covered with a fourth dielectric.

In the seventh aspect of the present invention, there is provided the line component in the sixth aspect which is characterized in that the third dielectric is formed by specifying the length of the third dielectric relative to the traveling direction of a high-frequency wave traveling in the dielectric to a prescribed length.

In the eighth aspect of the present invention, there is provided the line component in the sixth or seventh aspect which is characterized in that an uneven portion is formed on a surface of the first conductor and that the third dielectric is formed so as to provide an uneven portion.

In the ninth aspect of the present invention, there is provided the line component in any one of the sixth to eighth aspects which is characterized in that the permittivity of the third dielectric provided on at least one surface of a top surface, a bottom surface and side surfaces of the first conductor is higher than the permittivity of the fourth dielectric.

In the tenth aspect of the present invention, there is provided the line component in any one of the first to ninth aspects which is characterized in that the line component is formed so as to provide an uneven portion which is substantially perpendicular and/or substantially horizontal to a propagation direction of an electromagnetic wave.

In the eleventh aspect of the present invention, there is provided the line component in any one of the first to ninth aspects which is characterized in that in the line component, sections which are substantially perpendicular and/or substantially horizontal to a propagation direction of an electromagnetic wave are substantially the same.

In the twelfth aspect of the present invention, there is provided the line component in the first aspect which is characterized in that the power supply interconnection or the ground interconnection is formed roughly in the shape of a comb and that the power supply interconnection or the ground interconnection formed roughly in the shape of a comb is provided so that the power supply interconnection or the ground interconnection is provided in opposed relation via a dielectric.

In the thirteenth aspect of the present invention, there is provided the line component in the twelfth aspect which is characterized in that teeth of the comb constitute the power supply interconnection or the ground interconnection and that in the power supply interconnection or the ground interconnection formed in the shape of a comb, a back portion of the comb is extended substantially perpendicularly to the substrate.

In the fourteenth aspect of the present invention, there is provided a line component in which a trench is formed in a semiconductor substrate and which has a power supply interconnection disposed on the substrate in opposed relation via a dielectric. This line component is characterized in that the line component is constituted by the dielectric and the power supply interconnection and that a covering which covers at least the dielectric of the line component is provided.

In the fifteenth aspect of the present invention, there is provided a line component in which a trench is formed in a semiconductor substrate and which has a power supply interconnection disposed on the substrate in opposed relation via a dielectric. This line component is characterized in that the line component is constituted by the substrate, the dielectric and the power supply interconnection and that a covering which covers at least the dielectric of the line component is provided.

In the sixteenth aspect of the present invention, there is provided a line component which has a dielectric film formed on a principal surface of a semiconductor substrate, a diffusion layer formed on the principal surface of the semiconductor substrate, with the dielectric film sandwiched, and an interconnection formed on the dielectric film and in which a line is formed by including the semiconductor substrate, the dielectric film and the interconnection. This line component is characterized in that in a frequency band of an electromagnetic wave generated from a high-frequency source, a characteristic impedance of the line is set so that a peak value of power supply voltage which changes depending on the electromagnetic wave inputted to the line becomes not more than a prescribed value found on the basis of the power supply voltage.

In the seventeenth aspect of the present invention, there is provided the line component in the sixteenth aspect which is characterized in that the diffusion layer is connected to ground.

In the eighteenth aspect of the present invention, there is provided the line component in the sixteenth or seventeenth aspect which is characterized in that the line component further has a backing conductor which, along with the semiconductor substrate, the dielectric film and the interconnection, forms the line component and is electrically connected to the interconnection.

In the nineteenth aspect of the present invention, there is provided the line component in the eighteenth aspect which is characterized in that the line component further has, between the interconnection and the backing conductor, an insulating film which, along with the semiconductor substrate, the dielectric film, the interconnection and the backing conductor, constitute the line, and that the interconnection and the backing conductor are electrically connected by at least one contact hole which is formed in the insulating film.

In the twentieth aspect of the present invention, there is provided the line component in any one of the sixteenth to nineteenth aspects which is characterized in that the line component has a field oxide film on the principal surface of the semiconductor substrate outside the diffusion layer and that the dielectric film is formed thinner than the field oxide film.

In the twenty-first aspect of the present invention, there is provided the line component in any one of the first to twentieth aspects which is characterized in that in a frequency band of an electromagnetic wave generated from a high-frequency source, a characteristic impedance of the line is set so that a peak value of power supply voltage which changes depending on the electromagnetic wave inputted to the line becomes not more than a prescribed value found on the basis of the power supply voltage.

In the twenty-second aspect of the present invention, there is provided the line component in any one of the second to twenty-first aspects which is characterized in that the semiconductor substrate, the conductor layer and the second conductor are ground interconnections or connected to ground and that the first conductor is a power supply interconnection.

In the twenty-third aspect of the present invention, there is provided the line component in any one of the second to twenty-second aspects which is characterized in that the conductor layer has electric resistance larger than the electric resistance of the second conductor.

In the twenty-fourth aspect of the present invention, there is provided the line component in any one of the first to twenty-third aspects which is characterized in that the conductor layer is polycrystalline silicon.

In the twenty-fifth aspect of the present invention, there is provided the line component in any one of the first to twenty-fourth aspects which is characterized in that the length of the line component is large to an extent that an electromagnetic wave which is targeted behaves as a wave.

In the twenty-sixth aspect of the present invention, there is provided the line component in any one of the first to twenty-fourth aspects which is characterized in that the length of the line component is larger than ¼ of an effective wavelength of an electromagnetic wave which is targeted.

In the twenty-seventh aspect of the present invention, there is provided the line component in any one of the first to twenty-sixth aspects which is characterized in that the dielectric of the line component has induction loss.

In the twenty-eighth aspect of the present invention, there is provided a semiconductor circuit which is characterized in that the semiconductor circuit has the line component in any one of the first to twenty-seventh aspects.

FIG. 1 shows a circuit configuration diagram of a semiconductor circuit of the present invention. When a current i26 from a high-frequency source 29 flows through a conductor, coupling with other components tends to occur, eventually generating a high-frequency electromagnetic wave, which leaks. Therefore, in order to suppress a high-frequency current as close to a high-frequency source (for example, a switching component) as possible, a decoupling line component 27 is inserted as close to the source 29 as possible.

It is assumed here that the characteristic impedance of the line component 27 is denoted by Zc, that the characteristic impedance Zs within an LSI 29 in unknown, and that the characteristic impedance Z0 of a supply power line, which is a line to supply power, is from several tens of ohms to several hundreds of ohms or so in the range of a target frequency. In the present invention, the decoupling of such circuits is performed by reducing Zc. When the characteristic impedance Zc of the line component 27 is reduced, the high-frequency current i26 is bypassed by the line component and does not enter the DC current 28 side. That is, it might be thought that in the above-described semiconductor circuit, the decoupling characteristics are improved by reducing the characteristic impedance Zc of the line component. Now, FIG. 1 shows a simplified circuit in which the line component 27 is replaced with parallel admittance Yc and the series impedance element Zz of the line component is ignored as a negligible amount. The reflection coefficient Γ and the transmission coefficient T in this circuit are expressed by the elements S11 and S21 of the scattering matrix [S]:

$$[S] = \begin{bmatrix} S11 & S12 \\ S21 & S22 \end{bmatrix} \quad \text{[Formula 1]}$$

This scattering matrix [S] is expressed by the following equation:

$$[S] = \frac{1}{Yc' + 2} \begin{bmatrix} -Yc' & 2 \\ 2 & -Yc' \end{bmatrix} \quad \text{[Formula 2]}$$

where Yc'=Yc/Y0, Y0=1Z0, Yc=1/Zc

Hence, $$T = S11 = \frac{-Yc'}{Yc' + 2} = \frac{-1}{2 \cdot (Zc/Z0) + 1}$$

$$T = S21 = \frac{2}{Yc' + 2} = \frac{2 \cdot (Zc/Z0)}{2 \cdot (Zc/Z0) + 1}$$

On the condition that Z0>>Zc, Zc/Z0 can be approximated to 0 (zero). Therefore, when the reflection coefficient Γ and the transmission coefficient T are found, they are respectively Γ≈−1 and T≈0. This means perfect reflection and non-transmission. Because this solution is a solution for a high-frequency current, it follows that the high-frequency current i26 does not enter the DC power supply 28 side, which is a power supply system, and is reflected. That is, for a high-frequency current, decoupling with a DC power supply occurs and an electromagnetic radiation induced by a high-frequency current is significantly suppressed.

As described above, when an ordinary capacitor is used as a decoupling component, the decoupling characteristics deteriorate due to the effect of an increase in the inductance of a connection wiring portion of the decoupling capacitor and the interconnection and, particularly, in a high-frequency region the deterioration of the decoupling characteristics becomes remarkable.

For this reason, in the present invention, decoupling characteristics are improved by using a line component.

That is, for the characteristic impedance Zc of the above-described line component, in a case where an effective line component length (effective line length) is large to such an extent that this length can be regarded as a line, in other words, large to such an extent that an electromagnetic wave associated with a target high-frequency current behaves as a wave, this characteristic impedance can be expressed by Zc=$(L/C)^{1/2}$ regardless of frequency when the inductance of the line component per unit length is denoted by L and the capacitance per unit length is denoted by C. Because this impedance Zc (impedance per unit length) is almost constant, in a conventional capacitor the impedance (particularly, the inductance element of the capacitor) increases if Zc is reduced, with the result that decoupling characteristics deteriorate. However, by using a line component of the present invention in a semiconductor circuit, it is possible to obtain a semiconductor circuit having good decoupling characteristics in wide bands without the deterioration in decoupling characteristics. Incidentally, in the present invention, the characteristic impedance Zc is reduced by increasing the capacitance C.

Incidentally, the above expression "an effective line component length (effective line length) is large to such an extent that this length can be regarded as a line, in other words, large to such an extent that an electromagnetic wave associated with a target high-frequency current behaves as a wave" refer to that as a rough standard, an effective line component length is larger than ¼ or so of a wavelength corresponding to a minimum frequency of decoupling effective frequencies, and in this case, if a minimum frequency f1 of decoupling effective frequencies (frequencies of such an extent that can effectively exhibit decoupling characteristics) of a line component is denoted by f1, the wavelength is denoted by λ1, the dielectric constant of a line component is denoted by ∈ and the line component length is denoted by LEN1, then LEN1>λ1/(4√∈) and hence a minimum frequency f1 is defined by a frequency corresponding to λ1<4×√∈×LEN1. Therefore, in order to lower a lower limit to the decoupling effective frequency of a line component, it is necessary that an effective line component length of the line component be larger than ¼ or so of a wavelength corresponding to a minimum frequency.

If a maximum frequency of the decoupling effective frequencies of a line component is denoted by f2, the wavelength is denoted by λ2 and the distance from a high-frequency source to the line component is denoted by LEN2, then as a rough standard, the expression LEN2≈(1/30)·λ2/√∈ is obtained and a maximum frequency f2 is defined by a frequency corresponding to the wavelength of λ2=30×√∈×LEN2. Therefore, in order to raise the upper limit to the decoupling effective frequencies of the line component, it is necessary to shorten the distance from the high-frequency source to the line component. This numerical value 1/30 is as sufficiently small a value as a prescribed value used in the present invention and is here set at about 3% or so, which is a sufficiently small value, of the effective wavelength λ2/√∈. However, this value 1/30 may be, for example, 3% of the effective wavelength λ2/√∈, and furthermore, 2% or 1% or so can be adopted.

However, because in designing a line component of a wide band, for example, of several tens of kilohertz to 1 GHz or so there is a possibility that this line component becomes considerably long, it is also conceivable that in actuality, the line component is disposed in a distributed manner by dividing the band into several parts.

Also, it is required that in a usual decoupling capacitor, the peak value of variation in the power supply voltage due to the generation of a high-frequency wave by a switching component be not more than 5% of DC power supply voltage.

In the present invention, it is desirable that the characteristic impedance of a line component to be used be set so that the peak value of variation in the power supply voltage by a switching component is not more than 5% of DC power supply voltage, concretely, not more than 4%, preferably not more than 3%, and in the case of an especially severe setting, not more than 1%.

BRIEF DESCRIPTION OF THE DRAWINGS

FIG. 1 is a circuit diagram of low-impedance line component circuit related to a semiconductor circuit of the present invention;

FIGS. 5(A), 5(B), 5(C) and 5(D) are each a diagram of the second embodiment of a semiconductor circuit related to the present invention; FIG. 5(A) being a schematic perspective view, FIG. 5(B) a partial sectional view of a line component along the line X-X', FIG. 5(C) a partial sectional view along the line Y-Y' after the completion of manufacturing, and FIG. (D) an enlarged view of Part A in FIGS. 5(A) to 5(C);

FIG. 10(A) being a sectional view along the line Z-Z' of FIG. 10(B) and FIG. 10(B) a diagram of an example in which the line component shown in FIG. 10(A) is used in the semiconductor circuit;

FIGS. 11(A), 11(B) and 11(C) are each a diagram of the eighth embodiment of a semiconductor circuit related to the present invention; FIG. 11(A) being a sectional view along the line A-A' of FIG. 11(B), FIG. 11(B) a plan view, and FIG. 11(C) a perspective view of an example in which the line component of FIG. 11(A) is used in the semiconductor circuit; and FIGS. 12(A), 12(B) and 12(C) are each a diagram of the ninth embodiment of a semiconductor circuit related to the present invention; FIG. 12(A) being a sectional view along the line A-A' of FIG. 12(B), FIG. 12(B) a plan view, and FIG. 12(C) a perspective view of an example in which the line component of FIG. 12(A) is used in the semiconductor circuit.

Figure 2:
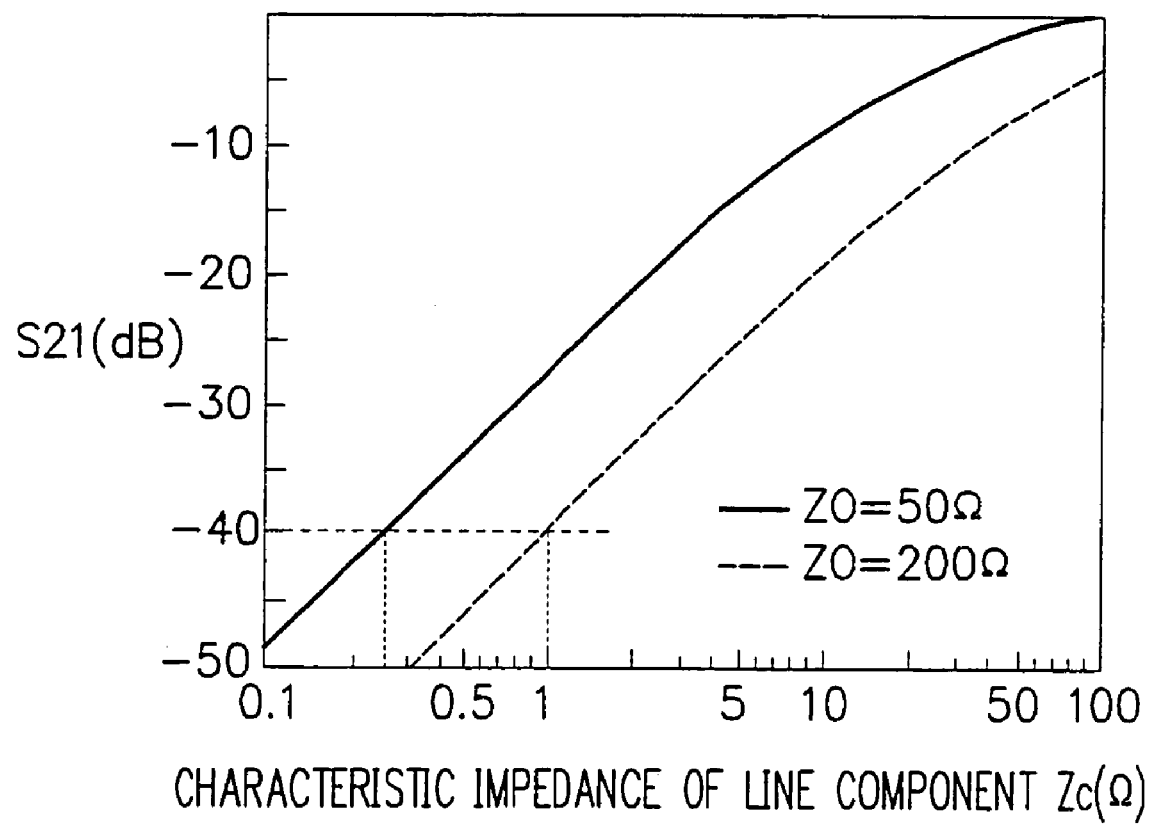
FIG. 2 is a diagram which shows the relationship between the characteristic impedance and transmission coefficient (S21) of a line component used in the present invention.

Incidentally, the numeral 1 denotes a substrate. The numerals 2, 4, 6, 8, and 17 denote a high-permittivity insulating film. The numeral 3 denotes polycrystalline silicon. The numerals 5 and 10 denote an aluminum interconnection. The numerals 7 and 9 denote a silicon oxide film. The numeral 14 denotes a field oxide film. The numerals 15 and 16 denote a diffusion layer. The numeral 19 denotes a contact hole. The numeral 20 denotes an interlayer dielectric film. The numeral 21 denotes a backing interconnection. The numeral 27 denotes a line component. The numeral 28 denotes a DC power supply. The numeral 29 denotes a high-frequency circuit. The numeral 30 denotes a ground substrate. The numeral 31 denotes an insulating film. The numerals 18 and 32 denote an interconnection.

BEST MODE FOR CARRYING OUT THE INVENTION

In the present invention, a power supply interconnection and a lead frame of a semiconductor package are each regarded as a line component, and the characteristic impedance of a line component is optimized by increasing the capacitance per unit length, whereby the decoupling characteristics of a power supply interconnection and a lead frame are optimized. As a result of this, the decoupling characteristics become improved in high-frequency regions which are much higher than in conventional power supply interconnections and lead frames. In order to improve decoupling characteristics with the present structures of power supply interconnection and lead frame, it is necessary to increase the capacitance per unit length compared to the present level.

Also, in the present invention, in order to widen the decoupling effective frequency band of a line component for the purpose of providing a semiconductor circuit which simultaneously meets wide band design, the line component length is increased to a certain degree. However, it is desirable that the interconnection area of the plane surface of a line component not increase, in other words, the occupied area of a line component in a semiconductor circuit not increase. For this reason, in the present invention, by forming a line component so as to provide an uneven portion, etc., and not by forming a line component in straight-line or planar shape, the line length is increased without an increase in the occupied area of a line component on a chip.

The manufacturing process is simplified by applying a manufacturing process of an LSI itself thereby to use a common process.

In the present invention, high-permittivity films are formed in layers on the top and bottom surfaces of a line component, thereby increasing the capacitance C and simultaneously preventing an increase in inductance, and the films are constructed so that high-frequency electromagnetic waves propagate, whereby a semiconductor circuit in which a lower-impedance line component is used has been realized.

With reference to usual circuits, the characteristic impedance of a power supply line, which depends on the type of interconnection, such as a printed wiring board interconnection and an on-chip interconnection, is in the range of 50-200Ω or so. FIG. 2 shows the relationship between the characteristic impedance and S21 of a line component when the impedance of a power supply line is 50Ω and 200Ω. In the present invention, the characteristic impedance Zc of a line component is calculated by referring to this FIG. 2 and to requirements for a peak value of voltage variation in the DC power supply voltage induced by an electromagnetic wave which is applied to a power supply interconnection. That is, the characteristic impedance of power supply interconnections constituting a line component is fixed so that a peak value of voltage variation becomes not more than a prescribed value, such as 1% to 5% of the power supply voltage.

Now, in a case where the condition for a peak value of power supply voltage of this switching component is set at a severer value of not more than 1%, i.e., when S21 is set at a severer value of not more than −40 dB, which is obtained by substituting a peak value of voltage variation/value of DC power supply voltage=0.01 (1% of the condition for a peak value of power supply variation) in the equation of S21 (dB)= 20 Log (peak value of voltage variation/value of DC power supply voltage), it is apparent from FIG. 2 that in the case of Z0=50Ω, it is necessary that the characteristic impedance of the line component be not more than 0.3Ω.

Figure 3:
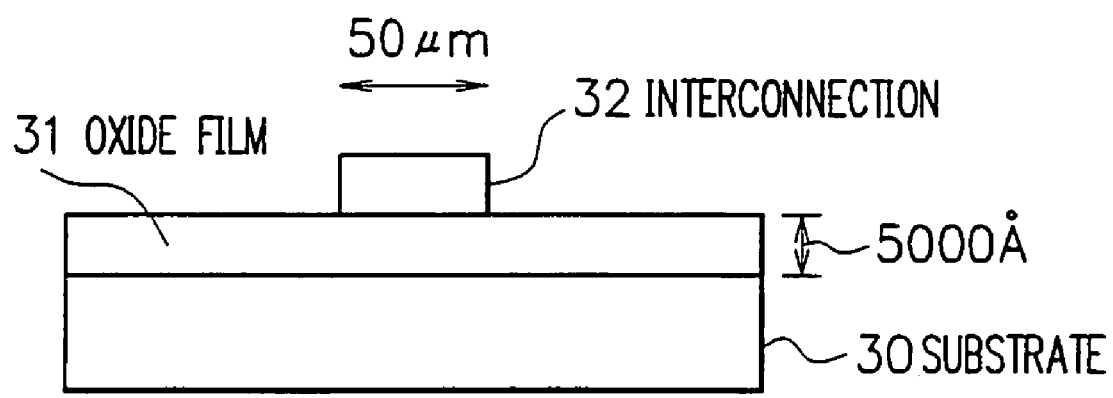
FIG. 3 is a sectional view of a typical semiconductor power supply interconnection.

FIG. 3 shows a typical construction of an on-chip power supply interconnection of a conventional semiconductor. The interconnection length is 1 mm, the interconnection width is 50 μm, the oxide film thickness is 5000 Å. The interconnection 32 is made of aluminum, the oxide film 31 is fabricated from $SiO_2$ having a dielectric constant of about 4, the substrate 30 is a high-dose silicon board, and the characteristic impedance is 50Ω or so. In the present invention, the characteristic impedance found by the above-described method is set at not more than 0.3Ω. For this purpose, it is necessary that the characteristic impedance be about 1/170 of a conventional level and that the capacitance per unit length be approximately 30,000 times a conventional level.

Hereinafter, a semiconductor circuit of the present invention will be described in detail by use of embodiments. However, the present invention should be construed without being limited by these embodiments and are not limited by numerical values and the like described in the embodiments.

First Embodiment

Figure 4:
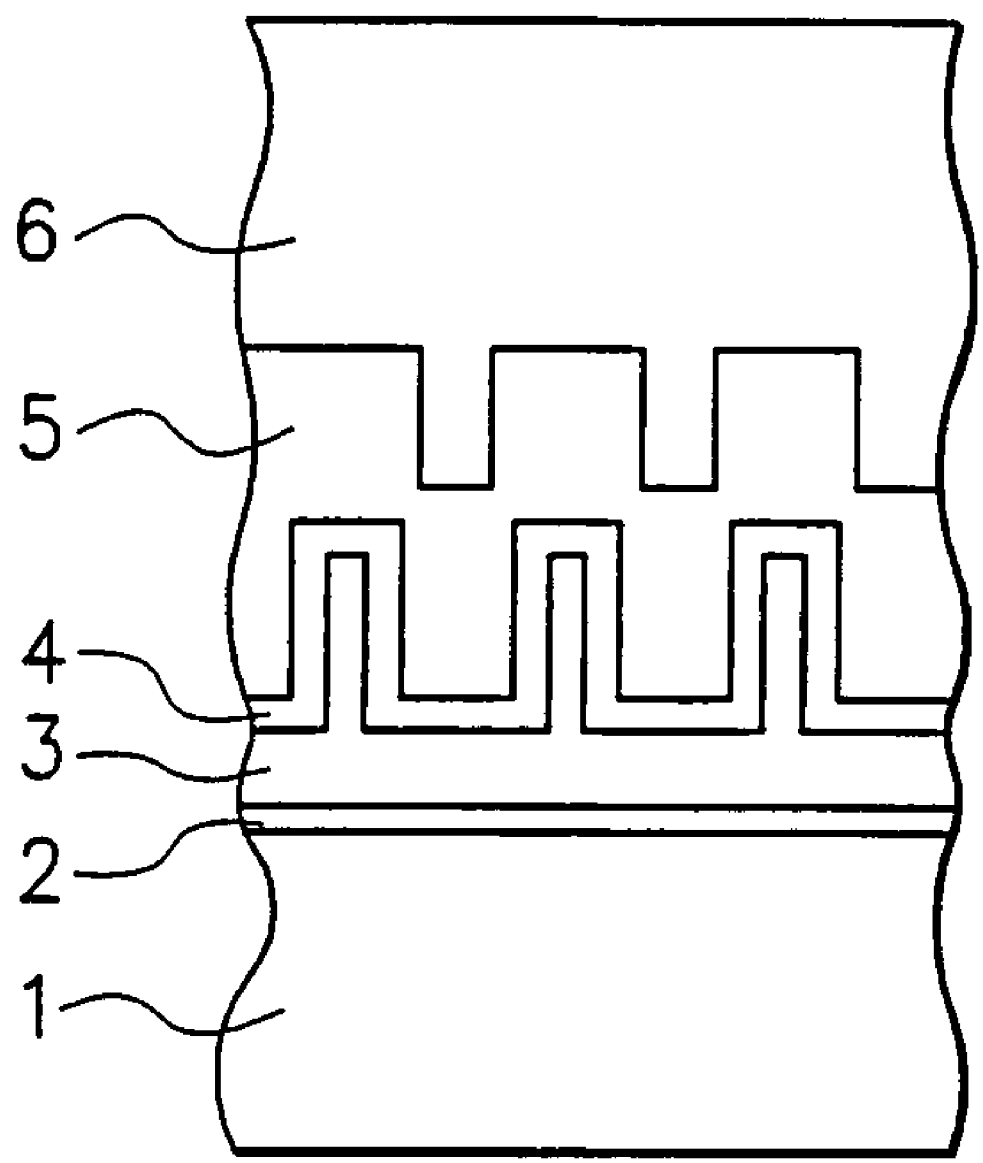
FIG. 4 is a diagram of the first embodiment of a semiconductor circuit related to the present invention (also side surfaces may be covered with dielectrics)

The first embodiment of a semiconductor circuit of the present invention is shown in FIG. 4. FIG. 4 is a partial sectional view of a semiconductor circuit in the width direction thereof. The two end portions of a line component portion in the length direction thereof are electrically connected to other interconnections via lead wires or alternatively, at least one end is electrically connected to another interconnection via a lead wire and the other end is terminated. It is preferred that a covering 6 covers also two end portions of the semiconductor circuit including a line component. It is possible to adopt a construction in which these lead wires are also covered. Also in other embodiments, the two ends or at least one end of a line component may be electrically connected to other interconnections via lead wires or alternatively, one end may be terminated. This embodiment is especially characterized in that the capacitance of a line component (the electrical capacity of this capacitance is also hereafter simply called "capacitance") is increased by adopting a material in which not only the permittivity of an insulating film between a power supply interconnection and a ground interconnection, but also the permittivity of insulating films a peripheral part of the line component (the top and bottom surfaces and side surfaces of the line component) is increased.

In this embodiment, polycrystalline silicon 3, a high-permittivity film 4 (preferably, $LaAlO_3$) and an aluminum interconnection 5 are laminated via a high-permittivity film 2 on a silicon substrate 1, and a line component is formed by the polycrystalline silicon 3, the high-permittivity film 4 and the aluminum interconnection 5. The polycrystalline silicon 3 is a ground interconnection, and the aluminum 5 is a power supply interconnection. The line component is formed by the polycrystalline silicon 3, which is a ground interconnection, and the aluminum 5, which is a power supply interconnection, in opposed arrangement (the ground interconnection and the power supply interconnection being opposed to each other via a dielectric film). The above-described line component is covered with a high-permittivity film 6, with the exception that the bottom surface of the line component is in contact with $LaAlO_3$. In order not to increase the occupied area within a semiconductor chip, and in order to ensure capacitance per unit length, an uneven portion is provided in the width direction of the line component so that the spacing between the opposite interconnections is maintained at a substantially constant distance. Incidentally, in the line component used in this embodiment, at least part of the line component or the whole line component is covered with a high-permittivity film. This is in common with that fact that it is preferred that in the present invention, at least part of a line component used in a semiconductor circuit or the whole area of this line component be covered with a high-permittivity film.

The line component which is concretely used in a semiconductor circuit in the first embodiment will be described. The oxide film thickness is decreased to 50 Å, which is 1/100 of the present thickness of 5000 Å, the material for the oxide film was changed from $SiO_2$ having a dielectric constant of about 4 to $LaAlO_3$ having a dielectric constant of about 24, which is six times higher, the interconnection was formed to provide projections and depressions, thereby to increase the capacitance per unit length to five times, the interconnection width was increased to 350 μm, which is seven times the present value of 50 μm, and the material for the peripheral part of the line component (the top part and side surfaces of each of the line components shown in FIGS. 6 to 8) was changed from the present $SiO_2$ to $LaAlO_3$. As a result of this, as the whole line component, it was possible to increase the capacitance per unit length to 100×6×5×7×1.5=31500 times. Incidentally, because capacitance is in inverse proportion to the dielectric film thickness, in this embodiment in which the film thickness is set at 1/100, it follows that this thickness 100 times contributes to capacitance.

In the example shown in FIG. 4, for a semiconductor on chip, an $LaAlO_3$ film 2 was formed on a silicon substrate 1 by a publicly known method (the CVD method and the like), polycrystalline silicon 3 (ground) was then formed by a publicly known method (the CVD method and the like), subsequently an uneven portion was formed by performing patterning by use of the obtained polycrystalline silicon 3 as a mask (the dry process with $BF_3$ etc. or the wet process with TMAC1 (tetramethylammonium salt) etc. was used), subsequently an $LaAlO_3$ film 4 was formed on the polycrystalline silicon 3 with a film thickness of 50 Å in the same manner as described above, an aluminum interconnection 5 (power supply interconnection) was formed by a publicly known method (for example, the evaporation method) and at least the whole line component (the upper part and side parts of the line component) was covered with an $LaAlO_3$ film 6. By covering the semiconductor circuit (or the line component) with such a high-permittivity body in film form, in this embodiment, it is possible to increase the capacitance per unit length and to reduce the characteristic impedance of the line component.

When the line component length in this on-chip condition is considered, assuming that the minimum frequency of the line component effective in decoupling is now 10 GHz (wavelength=30 mm), then the line component length must be not less than $\lambda/(4\sqrt{\varepsilon})$. In this first embodiment, because of the use of $LaAlO_3$ having a dielectric constant of about 24, it is necessary that the line component length be not less than 1.5 mm. As described in this embodiment, in a high-frequency region (signals approximate waves, whereby this embodiment becomes in agreement with the theory), in the line component, the high-permittivity insulating film in film shape can become an interconnection of this high frequency (an interconnection line component in which high-frequency waves travel). In a region in which when signals are regarded as waves like this and the embodiment has good compatibility with the theory (a high-frequency region), this line component length becomes an important factor. The same thing applies also to other embodiments, unless otherwise stated. Incidentally, a high-frequency signal source includes components having the switching function, such as an LSI or (and) an IC.

Second Embodiment

The second embodiment of a semiconductor circuit related to the present invention is shown in FIGS. 5(A), 5(B), 5(C) and 5(D). FIG. 5(A) is a partial perspective view of a line component portion used in a semiconductor circuit, FIG. 5(B) is a partial sectional view taken along the line X-X' of the line component used in the semiconductor circuit, FIG. 5(C) is a partial sectional view taken along the line Y-Y' of the line component, and FIG. (D) is an enlarged view of Part A in FIGS. 5(A) to 5(C).

As shown in FIG. 5(A), in the second embodiment, in order to increase the line length without an increase in the occupied area within a chip, an uneven portion is provided in the longitudinal direction (Y direction) of the line component as an addition to the first embodiment so that the spacing between the opposite interconnections is maintained at a substantially constant distance. Because as in the first embodiment an uneven portion is provided also in the X direction, the line component has a compact size as a whole. Incidentally, the effective line component length can be found on the basis of the ratio of the intensity of an inputted signal to the intensity of an outputted signal when the frequency of the inputted signal is changed.

As shown in FIG. 5(B), also in the second embodiment, the line construction is the same as in the first embodiment above. High-permittivity dielectrics are formed in layers on a substrate 1, a ground 3 is formed on the dielectrics in planar or linear shape, and in the longitudinal direction (Y direction) and lateral direction (X direction) of this ground 3, as shown in FIG. 5(A), a ground 3 is formed so as to provide an uneven portion. A power supply interconnection 5 is provided via a dielectric 4 in opposed relation to this ground 3. The same materials as used in the first embodiment can be used as the materials for the ground 3, the dielectric 4 and the power supply interconnection 5 of this embodiment.

On the basis of the first embodiment, a semiconductor circuit of this second embodiment is fabricated by forming an $LaAlO_3$ 2 on a silicon substrate 1, and then forming polycrystalline silicon 3 on the $LaAlO_3$ 2. By performing patterning by use of this polycrystalline silicon 3 as a mask, multiple projections were formed on the surfaces on both sides in the transmission direction in the shape of a comb as viewed from above, an interconnection 5 was then formed from aluminum after the formation of an $LaAlO_3$ film 4 in a thickness of 50 Å so that the whole was covered with the film-like $LaAlO_3$. In this embodiment, the line component length was increased 10 times or so without a change in the occupied area within a chip. The length necessary for the line component becomes 1.5 mm (or so) even when a minimum frequency is 1 GHz, which is one-tenth of the minimum frequency of the first embodiment.

Although these semiconductor circuits related to the present invention have been illustrated by the constructions shown in FIG. 4 and FIGS. 5(A) to 5(D), these structures may be formed by turning 90 degrees horizontally. In the first and second embodiments, the structures may be provided in the form of a comb or gathers. The shape of the structure is not especially limited. The shape may be symmetric or asymmetric. In the case of a symmetric structure, any of point symmetry, line symmetry and plane symmetry may be adopted and in the case of line symmetry, the structure may be symmetric with respect to any of the x-axis, the -y axis and the z-axis.

Although in this embodiment a high dielectric layer of $LaAlO_3$ is used as the underlayer of the polycrystalline silicon 3, any materials can be used so long as they have excellent electrical properties of an interface with the substrate which is an underlayer and it is not always necessary to use materials having a very high dielectric constant so long as materials meet the gist of the present invention.

Third Embodiment

Next, the third embodiment will be described with reference to FIG. 6.

In this embodiment, the thickness of oxide films 4 and 8 was changed from the present level of 5000 Å to 50 Å, the material for the oxide film 4 was changed from $SiO_2$ (dielectric constant: 4) to $LaAlO_3$ (dielectric constant: 24), and the capacitance per unit length was increased to five times by forming an uneven portion without a change in the interconnection width. Furthermore, the width of the power supply interconnection was set at 250 μm, and $LaAlO_3$ was formed on the top and bottom surfaces of the power supply interconnection and as a whole, the capacitance of the line component, which is constituted by a ground (for example, polycrystalline silicon) 3, a dielectric 4, a power supply interconnection (electrically conductive material: for example, aluminum) 5 and a high dielectric interconnection (for example, $LaAlO_3$) 8, per unit length was set at 100×6×5×5×2=30000 times. Compared to the first and second embodiments, the side surfaces of the component are not covered with a high dielectric film, but the side surfaces are covered with a dielectric having a smaller permittivity than the high dielectric interconnection 8.

Compared to the first embodiment, in this third embodiment, the dielectric layer 8 having a higher permittivity than a silicon oxide film 9 is provided on the top surface of the aluminum interconnection 5, and the line component, which is constituted by the ground (line or surface) 3, the high dielectric 4 and the power supply interconnection (conductor: for example, aluminum) 5 and the surface wave interconnection 8 on top of them, is formed, and this line component is further covered with a dielectric (for example, a silicon oxide film or a silicon nitride film having a lower permittivity than the dielectric layer 8). As a result of this, an electromagnetic wave which is caused to become incident on the interior of the dielectric becomes confined within the dielectric layer 8. That is, because the layer under the dielectric layer 8 is a conductor, the electromagnetic wave is reflected by this conductor layer, whereas because the layer above the dielectric layer 8 is a layer having a lower permittivity than this dielectric layer 8 and is enclosed by this upper layer, an electromagnetic wave is confined in the layer having a high permittivity, with the result that an electromagnetic wave of relatively high frequency propagates within the dielectric layer 8 as a surface wave. The dielectric 4 of the bottom surface has a ground layer (or a ground surface may be present) 1 as an under layer and electromagnetic waves of low to high frequency can also propagate. Therefore, it might be thought that the dielectric line in the upper part functions as a line component for relatively high frequencies and that the line in the lower part functions as a line component for low to high frequencies.

Figure 6:
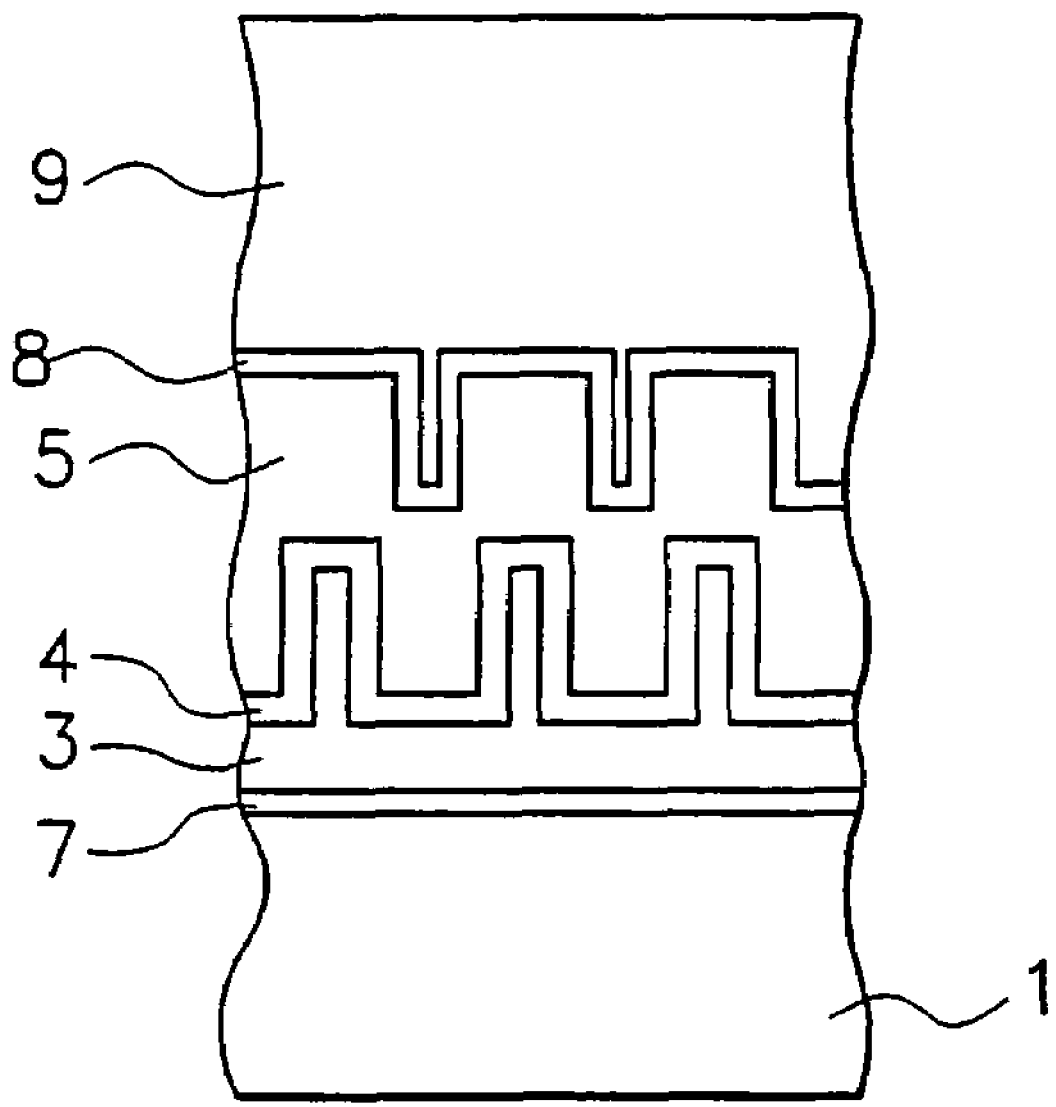
FIG. 6 is a diagram of the third embodiment of a semiconductor circuit related to the present invention (also side surfaces may be covered with dielectrics)

Thus, in the embodiment shown in FIG. 6, for example, a silicon oxide film 7 was formed on the silicon substrate 1, a polycrystalline silicon layer was formed on the silicon oxide film 7, an uneven portion was formed by patterning the polycrystalline silicon layer, after that, the LaAlO$_3$ film 4 was formed in a thickness of 50 Å, the aluminum interconnection 5 was formed in a thickness of 5000 Å, the LaAlO$_3$ film 8 was formed in a thickness of 50 Å, patterning was performed in the shape of the interconnection, and finally a cover film was formed by the silicon oxide film 9, whereby a semiconductor circuit of the present invention was fabricated.

In this embodiment, also the side surfaces of the power supply interconnection 5 can be covered by forming films, such as LaAlO$_3$ films, from a material of high permittivity.

Fourth Embodiment

Figure 7:
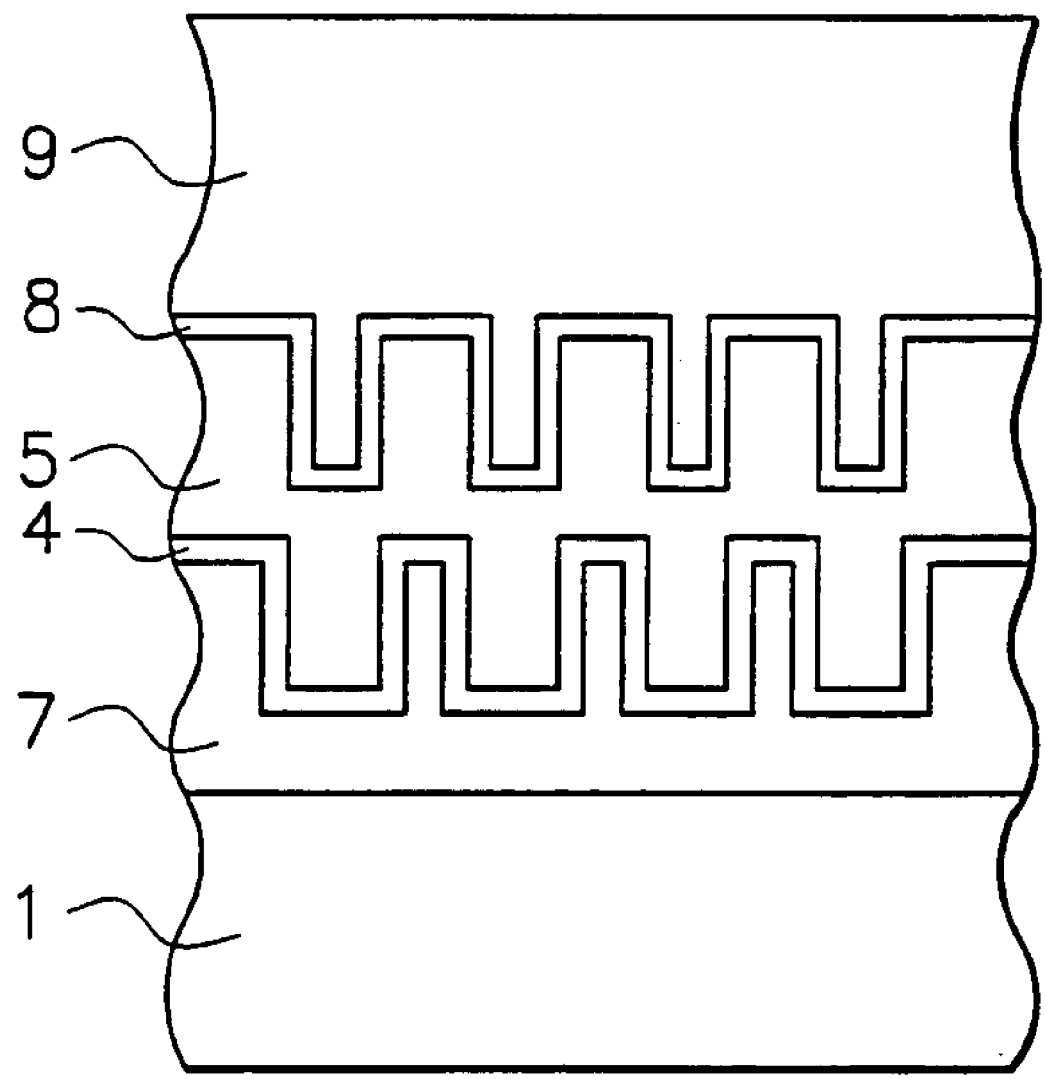
FIG. 7 is a diagram of the fourth embodiment of a semiconductor circuit related to the present invention (also side surfaces may be covered with dielectrics)

Next, the fourth embodiment will be described with reference to FIG. 7.

In this embodiment, as with the third embodiment above, the film thickness of oxide films 4 and 8 was set at 50 Å, the material for the oxide film 4 was changed to LaAlO$_3$ as with the third embodiment, and the capacitance per unit length was increased to five times by forming an uneven portion. Furthermore, the width of the interconnection was set at 250 μm, and LaAlO$_3$ was formed on the top and bottom surfaces of the interconnection and as a whole, the capacitance of the line component per unit length was set at 30000 times as with the third embodiment. Compared to the third embodiment, in this embodiment, the layer of polycrystalline silicon 3 was omitted and the film thickness of the silicon oxide film 7 was increased. Although a ground of polycrystalline silicon 3 is not present in the underlayer under the interconnection 5, in the same manner as the case of the dielectric layer 8 of the third embodiment 3, electromagnetic waves propagate as surface waves also in the dielectric layer, which is the underlayer. That is, in this embodiment, electromagnetic waves propagate also in the dielectric layers which are the overlayer 8 and the underlayer 4 of the conductor (conductor interconnection: for example, aluminum) 5. In this embodiment, even when there is no silicon substrate 1, DC lines (a power supply interconnection and a ground interconnection) and a high-frequency line exist, and because the construction as a line component is satisfied even when the substrate 1 (ground surface) is practically nonexistent, it is possible to omit the substrate as the line component. In this embodiment, as described above, the line component has the oxide film 4, the conductor 5 and the oxide film 8.

The semiconductor circuit shown in FIG. 7 was fabricated as follows. That is, a silicon oxide film 7 was formed on the silicon substrate 1 in the same manner as with the third embodiment, an uneven portion was formed in this silicon oxide film 7 by performing the same etching or the like as in the third embodiment, and the LaAlO$_3$ film 4 having a thickness of 50 Å, the aluminum interconnection (power supply interconnection) 5 having a thickness of 5000 Å and the LaAlO$_3$ film (surface wave line) 8 having a thickness of 50 Å were formed in this order on the silicon oxide film 7, whereby the semiconductor circuit having the line component was fabricated. Finally, a silicon oxide film 9 was formed as a cover film which covers at least part of the line component including the oxide film 4, the power supply interconnection 5 and the surface wave line 8 and the semiconductor circuit was fabricated in the same manner as the other embodiments.

In this embodiment, also the side surfaces of the power supply interconnection 5 can be covered by forming films, such as LaAlO$_3$ films, from a material of high permittivity. On this occasion, any arbitrary side surface can be covered. Also as in the second embodiment, an uneven portion may be provided in the transmission direction (in FIG. 7, in the direction perpendicular to the drawing). Although in this embodiment the high-permittivity films 4, 8 and the power supply interconnection 5 were used as the line component, it is also possible to use, as the line component, the oxide film (oxide film having a lower permittivity than the oxide film 4) 7, the oxide film (high dielectric oxide film) 4, the conductor (power supply line) 5, the oxide film (high dielectric) 8 and the oxide film (oxide film having a lower permittivity than the oxide film 8) 9 or these plus the substrate 1 (ground).

Fifth Embodiment

Figure 8:
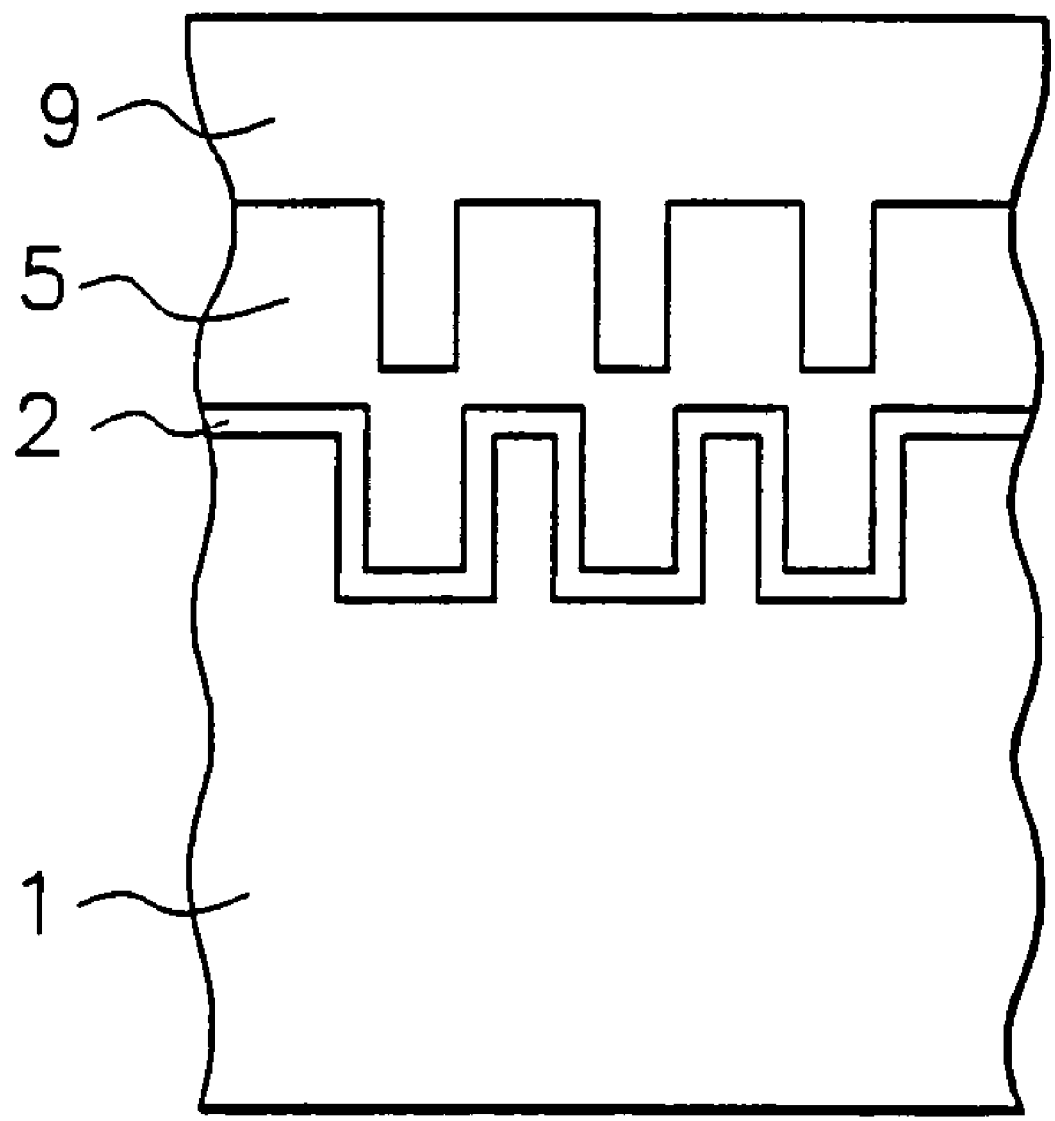
FIG. 8 is a diagram of the fifth embodiment of a semiconductor circuit related to the present invention (also side surfaces may be covered with dielectrics)

The fifth embodiment of a semiconductor circuit related to the present invention is shown in FIG. 8. In this embodiment, the number of layers of a line component which is used in a semiconductor circuit is reduced by applying a trench technique and the semiconductor circuit related to the present invention is realized by adopting a simplified process (semiconductor process).

As shown in FIG. 8, a line component which is used in a semiconductor circuit of the present invention is formed from a silicon substrate 1, a high-permittivity film 2 and aluminum 5. The silicon substrate is a ground surface, the aluminum 5 is a power supply interconnection, and this silicon substrate and the aluminum power supply interconnection 5 form opposite interconnections. In order to ensure the capacitance per unit length without an increase in the occupied area within a semiconductor chip, an uneven (concavo-convex) portion is provided on the substrate 1 in the width direction of the line component by use of a trench technique so that the spacing between the opposite interconnections is kept at a substantially constant distance, whereby the line component is formed so as to provide an uneven portion.

Also in the fifth embodiment, the thickness of the oxide film 2 was reduced from the present 5000 Å to 50 Å, LaAlO$_3$ having a dielectric constant of about 24 was adopted as the material for the oxide film 2, the capacitance per unit length was increased to 10 times by forming an uneven portion in the interconnection by use of a trench technique, the interconnection width was increased from the present 50 μm to 250 μm, whereby for the line component of the present invention used in a semiconductor circuit as a whole, the capacitance per unit length became 100×6×10×5=30000 times.

As shown in FIG. 8, in the semiconductor circuit of this embodiment, by using, for example, a trench technique which involves forming trenches on the silicon substrate 1 with hydrofluoric acid or the like, masking areas other than where trenches are to be formed, an uneven portion is formed on the silicon substrate 1, the LaAlO$_3$ film 2 having a thickness of 50 Å and the aluminum 5 having a thickness of 5000 Å are formed by deposition in this order, respectively, by CVD and sputtering, for example, on the substrate on which the trenches have been formed, subsequently, a mask is formed on the aluminum 5, the mask is removed after the removal of the aluminum other than the interconnection and the LaAlO$_3$ portion by etching (for example, phosphoric acid), the prescribed interconnection is formed, and after that, a silicon oxide film 9 is formed at least on the interconnection which has been provided as described above as a covering which covers the interconnection. As in the embodiments described above, this covering can cover the whole area of the top surface of the semiconductor circuit in which the line component is provided or the covering can cover one surface or two surfaces of the side surfaces of the semiconductor circuit (in the drawing, the surfaces in the vertical direction). Thus, also in this embodiment, the covering is formed to cover at least the top of the line component.

Incidentally, in this embodiment, as in the second and other embodiments, an uneven portion may also be formed in the transmission direction (the direction perpendicular to the drawing).

Also, as a modification to this embodiment, it is possible to mention an example of construction in which a dielectric 8 (for example, a high dielectric having a dielectric constant of not less than 4) as shown in the third embodiment is formed on the power supply line 5 thereby to form a line for surface waves. The concrete material for the dielectric 8 and the thickness of the laminated film are the same as in the third embodiment, and also the manufacturing method of the dielectric 8 is the same as in the third embodiment. Incidentally, also for the covering 9, as in the third embodiment, it is possible to use a material having a permittivity different from the permittivity of the dielectric 8, and for the dielectric constant of the dielectric 8, in the same manner as in the third embodiment, it is desirable to select a material for the dielectric 8 having a higher permittivity than the covering.

Sixth Embodiment

Figure 9:
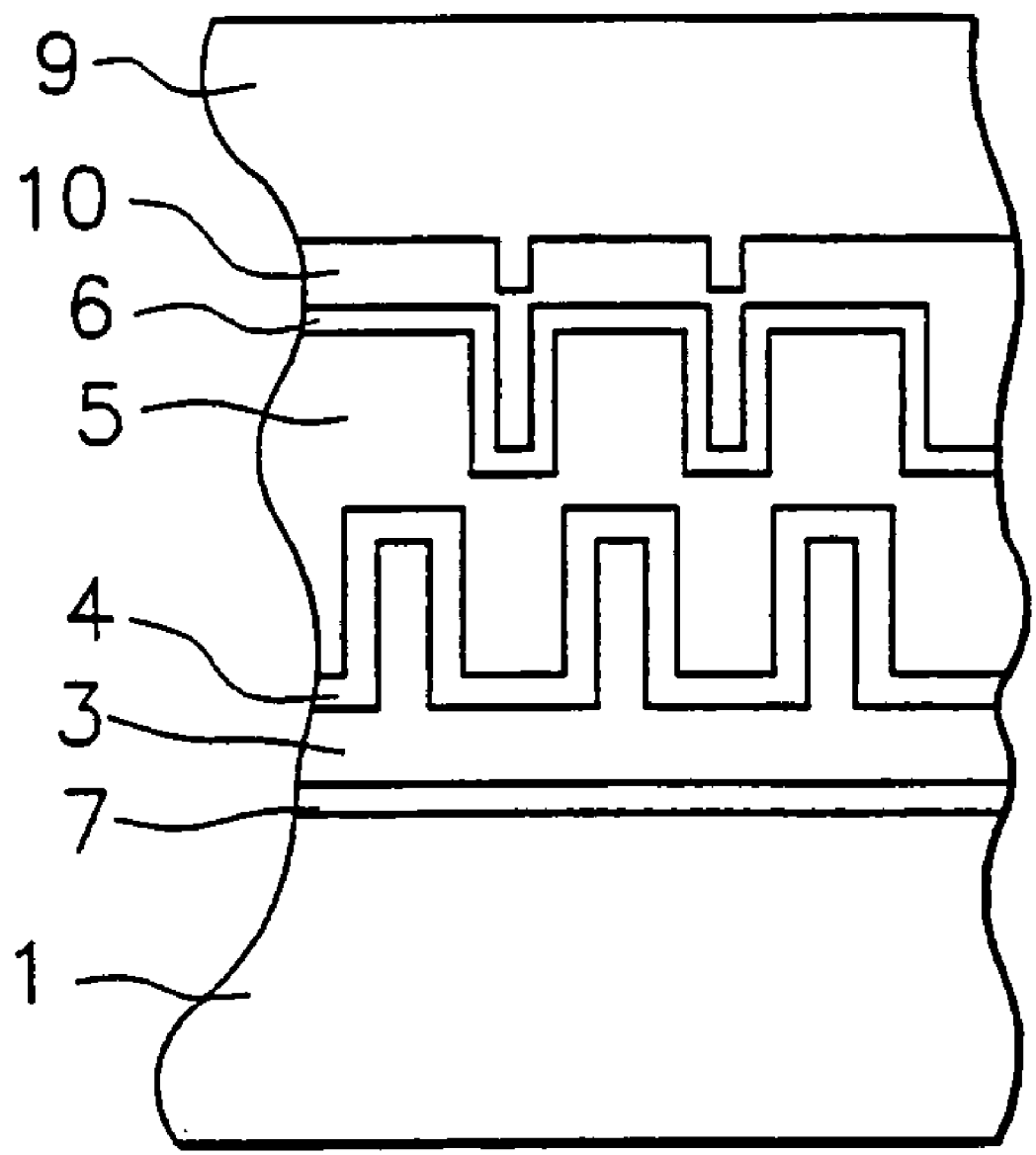
FIG. 9 is a diagram of the sixth embodiment of a semiconductor circuit related to the present invention (also side surfaces may be covered with dielectrics)

The sixth embodiment of a semiconductor circuit related to the present invention is shown in FIG. 9. Compared to the first embodiment, in this embodiment, a dielectric 6 and an aluminum interconnection 10 are laminated as overlayers and a line constituted by an interconnection 5, a dielectric 6 and the aluminum interconnection 10 is added to the top of the line of the first embodiment. The aluminum interconnection 10 is a ground interconnection. As a result of this, this embodiment is characterized in that the capacitance per unit length is increased without an increase in the occupied area within a chip.

In the sixth embodiment, the thickness of the oxide film is decreased from the present 5000 Å to 50 Å, the material for the oxide film is changed to $LaAlO_3$ having a dielectric constant of about 24, the capacitance per unit length is increased to five times without a change in the interconnection width by forming an uneven portion in the interconnection, the interconnection width is increased from the present 50 μm to 250 μm, and by forming $LaAlO_3$ and a ground interconnection on the top and bottom surfaces of the interconnection, the capacitance per unit length for the whole line component is increased to 100×6×5×5×2=30000 times. Although in the case of the line component of the first embodiment, for example, two kinds of lines having different electric conductivities are provided via a dielectric (high-permittivity dielectric: for example, a material having a dielectric constant of not less than 4 or exceeding 4), in the line component used in this sixth embodiment, lines having almost the same electric conductivity are provided via dielectric. And in this embodiment, it is also possible to select a line component including the line components shown in FIGS. 6 to 8, which have the same construction as the line component of the first embodiment. When they are selected as a line component structure, a ground and a power supply interconnection which are provided in an opposed relation are such that the reference numeral 1 denotes the ground and the reference numeral 5 denotes the power supply interconnection, or the line component structure is such that although the power supply interconnection 5 does not change, the ground 3 and the power supply interconnection 5 are provided via the dielectric 4 in the same manner as the structure of the line component used in the first embodiment, or alternatively, the reference numerals 2 and 10 denote the ground, the reference numeral 5 denotes the power supply interconnection, and the power supply interconnection 5 and the grounds 3 and 10 are provided in opposed relation via the dielectric 4 or 6, respectively, thereby to form a sandwich-like line component structure.

As shown in FIG. 9, in the semiconductor circuit of this embodiment, a silicon oxide film 7 is formed on the silicon substrate 2 by using a usual manufacturing method, after that, the polycrystalline silicon 3 is formed by applying a method such as CVD, after that, an uneven portion is formed, with the polycrystalline silicon masked, by performing patterning by use of dry etching or wet etching with hydrofluoric acid or TBAC (tetrabutylammonium chloride) etc., the $LaAlO_3$ film 4 is formed in a thickness of 50 Å after the formation of the uneven portion, aluminum is laminated (for example, an evaporation method), the $LaAlO_3$ film 6 is further formed in a thickness of 50 Å, the line shape is formed by etching after the formation of the aluminum 10, and after that, a cover film is formed from a silicon oxide film 9 by applying CVD etc., whereby the semiconductor circuit is fabricated.

Seventh Embodiment

Figure 10:
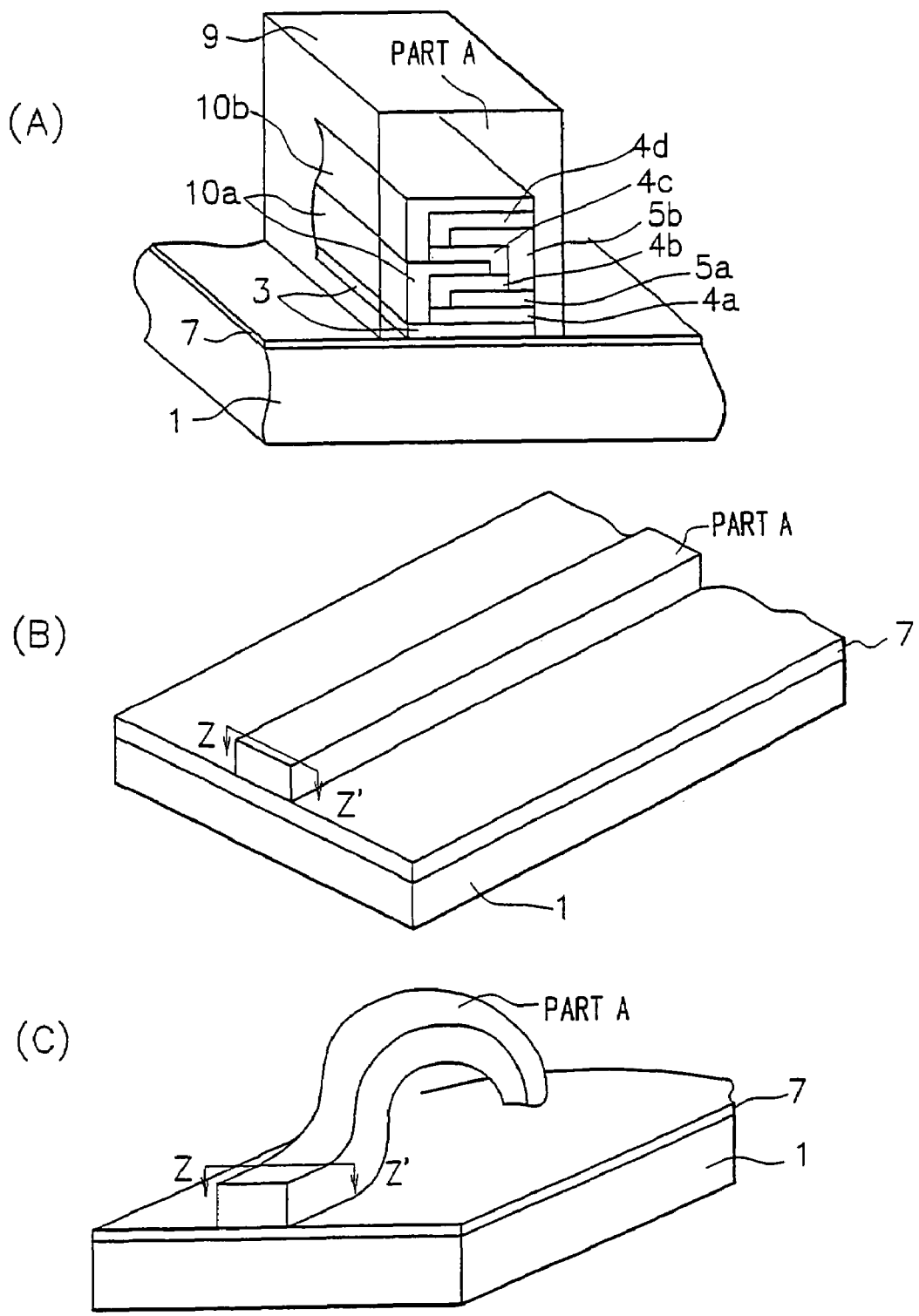
FIGS. 10(A), 10(B) and 10(C) are each a diagram of the seventh embodiment of a semiconductor circuit related to the present invention.

The seventh embodiment is shown in FIGS. 10(A), 10(B) and 10(C). In FIG. 10(A), Part A is a line component, an example in which a line component as shown in Part A is used in a semiconductor circuit of the present invention is shown in FIG. 10(B), and FIG. 10(C) shows an example in which a line component itself is formed so as to exhibit unevenness. Also this embodiment is characterized in that as in the sixth embodiment, by laminating an interconnection and a dielectric film, the capacitance per unit length is increased without an increase in the occupied area on a chip, which is necessary for the interconnection. Although FIG. 10(A) is a sectional view taken along the line Z-Z' of FIG. 10(B), the shape shown in this embodiment is for illustrative purposes and it is enough if the power supply interconnection and the ground interconnection are not in an electrically conducting condition, that is, if the power supply interconnection and the ground interconnection are laminated via a dielectric, and hence it is possible to freely select combinations of shapes. Part A of FIG. 10(A) shows an example in which an uneven portion is provided perpendicularly to a substrate 1. However, for example, an uneven portion may be provided substantially parallel to the substrate or may be provided to form an angle with the substrate 1 (this angle may be constant or vary, or this angle may vary continuously). Also, an uneven portion may further have another uneven portion. Also, uneven portions may be provided in multiple numbers. Although the line component shown in FIG. 10(B) is formed linearly on the whole, it is also possible to provide an uneven portion three-dimensionally as shown in FIG. 10(C). Incidentally, the sectional shape along the line Z-Z' of FIG. 10(B) is preferably the same shape.

As in the other embodiments, in this embodiment, the line component is provided on the substrate 1, and the line component which is used in a semiconductor circuit is such that a ground and a power supply interconnection are in an electrically nonconducting state via a dielectric, and the dielectric which is supported by being sandwiched between the ground and the electric power interconnection is also a high-frequency line. And for the characteristic impedance of the line component, as with other embodiments, the above-described impedance value of the line component used in the above-described semiconductor circuit is fixed so that a peak value of voltage variation of a DC power supply is held within a prescribed range due to the effect of high frequencies.

In this seventh embodiment, the oxide film thickness is reduced from the present 5000 Å to 50 Å, LaAlO$_3$ having a dielectric constant of about 24 is adopted as the material for the oxide film, the capacitance per unit length is increased to 2.5 times without a change in the occupied width within a chip by forming the interconnection so as to provide an uneven portion which is horizontal to the substrate 1 (this uneven portion is omitted in FIG. 10(A)), the interconnection width is increased from the present 50 µm to 250 µm, the two interconnection layers and the three ground layers are laminated via an LaAlO$_3$ film, the interconnection layers are electrically connected together and the ground layers are electrically connected together, whereby the capacitance per unit length is increased to 4 times and the capacitance per unit length as a whole is increased to 100×6×2.5×5×4=30000 times.

In this embodiment, in the same manner as in the above-described sixth embodiment, a silicon oxide film 7 is formed on the silicon substrate 1 and polycrystalline silicon 3 is formed on the silicon oxide film 7 (Step S100). Next, an uneven portion is formed by patterning the polycrystalline silicon 3 by use of a mask, an LaAlO$_3$ film 4a is formed in a thickness of 50 Å (Step S101), and an interconnection 5a is formed from aluminum by use of an evaporation method etc. (Step S102). Furthermore, an LaAlO$_3$ film 4b is formed in a thickness of 50 Å (Step S103), and after the formation of a contact hole, a ground interconnection 10a is formed from aluminum (Step S104) and the polycrystalline silicon 3 and the ground interconnection 10a are electrically connected together (Step S105). Furthermore, an LaAlO$_3$ film 4c is formed in a thickness of 50 Å, and after the formation of a contact hole, a power source interconnection 5b is formed from aluminum (Step S106) and is electrically connected to the aluminum interconnection 5a (Step S107). Furthermore, an LaAlO$_3$ film 4d is formed in a thickness of 50 Å (Step S108), and after the formation of a contact hole, a ground interconnection 10b is formed from aluminum (Step S109) and is electrically connected to the ground interconnection 10a (Step S110). After that, a cover film is formed from a silicon oxide film 9 (Step S111).

In this embodiment, by use of the above-described manufacturing method, a ground interconnection in the form of a comb having a section which extends upward is formed by laminating the polycrystalline silicon 3 and the aluminum interconnections 10a, 10b on the silicon substrate 1 via the silicon oxide film 7, a power source interconnection is formed by laminating the aluminum interconnections 5a, 5b and branching them in the form of a comb or a branch, the spacing between the power source interconnection and the ground is kept at a substantially constant distance by a method which involves interposing the insulating films 4a, 4b, 4c, 4d and the like thereby to maintain an electrical noncontact state, whereby the line is formed. Furthermore, an uneven portion is formed also on the surfaces of the power source interconnection and the ground interconnection. The power source interconnection may be formed from the polycrystalline silicon and the aluminum interconnections 10a, 10b and the ground interconnection may be formed from the aluminum interconnections 5a, 5a. In this embodiment, the underlayer is polycrystalline silicon and this is because the polycrystalline silicon has good matching with the silicon used as the substrate 1. Thus, in the present invention, the line component is used in an on-chip condition while making the most of the features of a semiconductor process. Therefore, when the line component is used in a semiconductor, the structure is such that the coupling with a power supply circuit is minimized as far as possible while high-frequency waves are confined within the dielectrics which constitute the line component. Therefore, a semiconductor circuit excellent in decoupling characteristics can be designed.

Eighth Embodiment

The eighth embodiment of the present invention will be described with reference to FIGS. 11(A), 11(B) and 11(C).

In this embodiment, the film thickness of an insulating film within a line component is reduced by using an insulating film (for example, a gate insulating film of a transistor) which is used in another portion within the same chip, whereby a low-capacitance line component is realized.

FIGS. 11(A), 11(B) and 11(C) show the construction of a line component used in a semiconductor circuit related to this eighth embodiment. In this line component, a line component and diffusion layers 15, 16 are formed in spaced relation on a semiconductor substrate 1 formed by silicon and the like, and a dielectric film 17 is disposed in the region between the diffusion layers 15 and 16. An interconnection 18 is further disposed on this dielectric film 17.

An isolation region (a field oxide film) 14 is formed on the semiconductor substrate 1 around the diffusion layers 15, 16, and the areas inside and outside the region enclosed by the field oxide film 14 are electrically isolated. As shown in the figures, it is preferred that each of the diffusion layers 15, 16 be connected to ground. In the structure mentioned above, the semiconductor substrate 1, the dielectric film 17 and the interconnection 18 constitute the line component. Incidentally, the semiconductor substrate 1 and the diffusion layers 15, 16 may have the same polarity or may have different polarities. This means that, for example, when the semiconductor substrate 1 is of the N type, N$^+$ type diffusion layers 15, 16 may be provided or P$^+$ type diffusion layers may be provided. The same thing applies also to a case where semiconductor substrate 1 is of the P type. Incidentally, in this embodiment, in FIGS. 11(A) and 11(B), it is general practice to short circuit the substrate 1 and the source and/or the drain to obtain the same potential or to ground them.

Hereinafter, a description will be given of a case where the semiconductor substrate 1 is of the P type and the diffusion layers 15, 16 are of the N$^+$ type, for example. As is apparent from FIG. 6, the structure constituted by the semiconductor substrate 1, the diffusion layers 15, 16, the dielectric film 17 and the interconnection 18 is the same construction as a MOS type transistor. That is, in this embodiment, a structure in which the gate electrode of a MOS type transistor is used as a line component is adopted, and the structure is such that the diffusion layers 15, 16 correspond to the source and the drain, the dielectric film 17 corresponds to the gate insulating film, and the interconnection 18 corresponds to the gate electrode.

The dielectric film 7 may be formed from materials, such as SiO2, SiO, SiN, TaO$_2$, TiO$_2$, Al$_2$O$_3$, MgO, SrTiO$_3$, ZrO$_2$ and LaAlO$_3$. These dielectric materials may be used singly or it is possible to use combinations of two kinds or more. These materials are capable of being used particularly in a silicon semiconductor process and hence are suitable for this purpose. For the interconnection 18, materials such as polycrystalline silicon and metals such as aluminum, aluminum alloys and copper. The diffusion layers 15, 16 are regions in which impurities (for example, arsenic, phosphorus and boron) are diffused in high concentrations.

In this embodiment, by forming a line component from a gate insulating film of a MOS transistor, it is easier to increase the interconnection capacity than in a case where a line component is formed from a field oxide film 14 the film thickness of which is generally 500 to 1000 nm (5000 to 10000 Å).

Furthermore, because line components having such capacitance can be manufactured by applying a process for manufacturing transistors within LSIs, it is possible to simplify the manufacturing process.

Next, a manufacturing process of a line component which is used in a semiconductor circuit related to this embodiment will be described.

First, a field oxide film 14 is formed around a region on a semiconductor substrate 1 where a MOS transistor is to be formed (Step S201). For example, in a case where the semiconductor substrate 1 is a P type semiconductor formed from silicon, the field oxide film 14 is formed by oxidizing the surface of the semiconductor substrate 1. Next, a dielectric film is formed on the surface of the semiconductor substrate 1 as a gate insulating film (Step S202). After that, a conductive film is formed on this formed dielectric film (Step S203). The conductive film is formed from polycrystalline silicon in film shape by use of the low-pressure CVD method and the like. With the obtained conductive film masked, unnecessary portions are etched and after the removal of the mask, the dielectric film 17 and the interconnection 18 are formed in specified interconnection shape (Step S204). After that, in the region of the surface of the semiconductor substrate 1 enclosed by the field oxide film 4, ions are implanted into the areas of both end portions of the interconnection 18 so as to provide a polarity reverse to the polarity of the semiconductor substrate 1, whereby the diffusion layers 15 and 16 are formed (Step S205). For example, in a case where the semiconductor substrate 1 is a P type semiconductor, N$^+$ type diffusion layers are formed.

By use of the above-described process, a line component constituted by the semiconductor substrate (ground) 1, the dielectric film 17 and the interconnection (power supply interconnection) 18 is formed.

When voltage is applied to the interconnection 18 of such line component construction, the semiconductor substrate 1 is also affected by the voltage and the substrate voltage varies a little. However, the magnitude of voltage variation can be minimized by providing the diffusion layers 15 and 16 on both end portions of the line component and connecting these to ground.

Ninth Embodiment

The ninth embodiment of a semiconductor circuit of the present invention will be described.

A line component which is used in a semiconductor circuit related to this embodiment is of such a construction that in a case where a gate insulating film of a transistor is used, when the resistance of a gate electrode of the transistor is different from the resistance of an interconnection, an electrical bypass is provided on the reverse surface side of the surface facing to the gate insulating film in what is called a "backing" manner, whereby the resistance of the line component is adjusted and the capacitance of this line component is increased.

FIGS. 12(A), 12(B) and 12(C) show the construction of a line component which is used in a semiconductor circuit related to this embodiment. In this line component, on a P type or N type semiconductor substrate 1 formed from silicon etc., there are formed diffusion layers 15, 16 having a polarity reverse to the polarity of the semiconductor substrate 1, with a spacing provided between the two, and a dielectric film 17 is disposed in the region between the diffusion layers 15 and 16. And an interconnection 18, an interlayer dielectric film 20 and a backing on the dielectric film 17 are further laminated on the dielectric film 17. Incidentally, at least one contact hole 19 is formed in the interlayer dielectric film 20, and the interconnection and the backing interconnection 21 are electrically connected together via the contact hole 19. Incidentally, the interconnection 18, the contact hole 19 and the backing interconnection 21 constitute part of a power supply interconnection which supplies power to a switching component.

An isolation region (a field oxide film) 14 is formed on the semiconductor substrate 1 around the diffusion layers 15, 16, and the areas outside and inside the region enclosed by the field oxide film 14 are electrically isolated. Also, each of the diffusion layers 15, 16 is connected to ground. In the above-described structure, the semiconductor substrate 1, the dielectric film 17, the interconnection 18, the interlayer dielectric film 20 and the backing interconnection 21 constitute the line component.

As is apparent from FIGS. 12(A), 12(B) and 12(C), the structure constituted by the semiconductor 1, the diffusion layers 15, 16, the dielectric film 17 and the interconnection 18 is a MOS type transistor. As with the second embodiment, also this embodiment is a structure in which a gate electrode of a MOS type transistor is used, and the diffusion layers 15, 16 correspond to the source and the drain, the dielectric film 17 corresponds to the gate insulating film, and the interconnection 18 corresponds to the gate electrode.

As the materials for the dielectric film 17 and the interlayer dielectric film 20, it is possible to use $SiO_2$, SiO, SiN, $TaO_2$, $TiO_2$, $Al_2O_3$, MgO, $SrTiO_3$, $ZrO_2$, $LaAlO_3$, etc. These materials have good compatibility with a silicon semiconductor process and, therefore, they are suitable as materials the dielectric film 17 and the interlayer dielectric film 20. These dielectric materials may be used singly or in combination. As the materials for the interconnection 18 and the backing interconnection 21, polycrystalline silicon and metals such as aluminum, aluminum alloys and copper. Incidentally, for the semiconductor substrate 1, the same material as described in the first embodiment is used.

In the case of a structure in which a gate electrode of a MOS type transistor is used, if the interconnection 18 is formed from a material having a relatively low electrical conductivity (for example, impurity diffused polycrystalline silicon), then the resistance of the interconnection 18 increases. In this case, the DC supply capacity deteriorates.

In a line component which is used in a semiconductor circuit related to this embodiment, the resistance of the interconnection 18 is reduced by forming the backing interconnection 21 from aluminum etc. As the materials for the backing interconnection 21, metals such as aluminum alloys and copper can be used in addition to aluminum.

In the ninth embodiment of the present invention, in a case where the interconnection 18 in the above-described eighth embodiment of the present invention is formed from polycrystalline silicon and the resistance of the interconnection 18 is relatively high, the backing interconnection 21 is formed from metals such as aluminum in order to reduce the resistance of the interconnection 18. As the materials for the backing interconnection 21, metals such as aluminum alloys and copper can be used in addition to aluminum. In some cases, organic conductors (polypyrrole, polyacetylene, etc.) can also be used. In the eighth embodiment of the present invention, the interlayer dielectric film 20 is formed as the overlayer of the interconnection 18, which is a polycrystalline silicon film, and as the overlayer of this interlayer dielectric film 20 the backing interconnection 21 formed from an aluminum metal, which has a lower resistance than the polycrystalline silicon film. The backing interconnection 21 and the interconnection 18 are electrically connected together via the contact hole 18, the number of which is one or more.

Next, a description will be given of a method of manufacturing the above-described semiconductor circuit shown in the ninth embodiment of the present invention.

In the ninth embodiment of the present invention, after the formation of the interconnection 18 (power supply interconnection), the interlayer dielectric film 20 made of a silicon oxide film is formed. Subsequently, the contact hole 19 is made in the interlayer dielectric film 20, and next, after the formation of a conductor film of aluminum on the surface of the interlayer dielectric film 20 including the interior of the contact hole 19, this conductor film is patterned, whereby the backing interconnection 21 is formed.

When decoupling in a lower-frequency band is considered, in a case where the required line component length becomes large and the size of a line component in an on-chip state is too large, it is also possible to mount the line components used in the above-described first to ninth embodiments directly on a printed circuit board or dispose them as individual line components, or to adopt a method by which the line components are mounted on lead frames such as packages. However, good decoupling characteristics are obtained when a decoupling component is disposed near a component which generates high-frequency waves, for example, a switching component, and this is favorable for superhigh-speed design. And a method by which a line component is on-chip mounted is favorable for high-density design. Therefore, line components can be installed in multiple places of on-chip area, lead frame and printed circuit board to achieve wide-band design of decoupling effective frequency of a line component and to further improve decoupling characteristics, thereby eventually realizing superhigh-speed design and high-density design. Interconnections and dielectric films are formed in these semiconductors by using the CVD method, the evaporation method, etc. which are adopted in usual semiconductor processes. Etching treatment is performed by the wet process including phosphoric acid treatment, hydrofluoric acid treatment and quaternary ammonium slat treatment, or the dry process which involves conducting treatment by forming fluorine ions (compounds containing fluorine such as $BF_3$) by discharge, and the like. Also, it is possible to form the shape of an uneven portion by using nanotechnology such as FIB (focused ion beam) and MEM (micro-electro-mechanical) system.

In this embodiment, numerical values such as −40 dB and 0.3Ω are given as examples for convenience of explanation, and even numerical values other than these values are included within the scope of the present invention so long as they meet the gist of the invention. The features of the present invention lie in wide bands and low impedance, and it is expected that the above-described numerical values vary greatly when the present invention is applied as a substitute for a usual capacitor by making the most of this characteristic.

Also, various kinds of modifications to the permittivity of various materials used in line components which are used in the semiconductor circuits related to the present invention, the film thicknesses, line component lengths, aspect ratios of uneven portions, and structural combinations of uneven portions, are included in the present invention.

Although the present invention can be manufactured by a silicon semiconductor process, it is natural that the invention is not limited to this process, and it is possible to apply semiconductor processes other than those of conventionally known silicon semiconductors. Thus, it is not needless to say that the present invention can be used in all electronic equipment which requires the electrical properties of the present invention.

As the materials for films having different dielectric constants capable of being used as insulating films, it is possible to use epoxy resins having a dielectric constant of about 4, which is almost the same as the dielectric constant of a silicon oxide film, SiO, nitride silicon, $TaO_2$, $TiO_2$, $Al_2O_3$ and MgO, which have a dielectric constant of about 8, $SrTiO_3$, $ZrO_2$ and polycrystalline silicon, which have a dielectric constant of about 16, $LaAlO_3$ having a dielectric constant of about 24, BST (Ba—Sr—$TiO_2$) having a dielectric constant of about 300, PZT (Pb—Zr—$TiO_2$) having a dielectric constant of about 1000 and other materials having a high dielectric constant. It is preferred that materials having a high dielectric constant capable of being adopted in a silicon process etc. be selected, and in this case, the process becomes simple and is advantageous also in terms of cost.

For the characteristic of a line component, it might be thought that high-frequency electromagnetic waves generated in a high-frequency source are less apt to propagate to the power supply side when the dielectric loss (tan δ) is large, with the result that decoupling characteristics are improved. It is preferred that the dielectric loss be large to such an extent that electromagnetic waves incident on a line component are heat consumed or can be non-terminated.

In the above-described second embodiment, the structure is such that the uneven portion is provided in both directions of X-axis and Y-axis directions. However, the provision of this uneven portion in a uniaxial direction (for example, X-axis direction, Y-axis direction, Z-axis direction) or triaxial directions is also included in a semiconductor circuit related to the present invention. Although the shape of the uneven portion is not especially limited, it is desirable to select a shape which enables an uneven portion to be formed by using a semiconductor process. Incidentally, the uneven portion may be fabricated by forming a trench within a substrate, or an uneven portion may be formed on a substrate from a conductor or a dielectric and an interconnection which constitutes other line components may be formed on this uneven portion, and a line component can be formed by using uneven portions formed within the substrate and on the substrate. In this case, when an uneven portion is formed from dielectric material, the material for a film formed on the uneven portion is selected from materials having a higher dielectric constant than this dielectric or an interconnection which constitutes a line component is formed in film shape from an electrically conductive material, whereby a semiconductor circuit in which line components as described in each of the above embodiments are used can be manufactured.

INDUSTRIAL APPLICABILITY

A semiconductor device of the present invention has a line component in the interconnection thereof, and a semiconductor circuit in which such a line component is used has substantially constant impedance in frequency bands in which the semiconductor circuit is used. Therefore, the semiconductor device has stable low-impedance characteristics in wide frequency bands and, therefore, the power source decoupling of high-speed semiconductor circuit can be realized. Because in wide frequency bands, the power voltage little varies due to the frequencies, stable action is ensured. Because it is very rare that high-frequency waves leak, a semiconductor circuit excellent also in EMC measures can be provided.

The invention claimed is:

1. A line component in which a power supply interconnection and a ground interconnection or a ground surface are disposed in opposed relation via a first dielectric, wherein a covering which covers the line component is provided, that a second dielectric having a higher permittivity than silicon oxide is provided on the other surface which is not opposed to the ground interconnection or ground surface of the power supply interconnection, and that the second dielectric has a permittivity larger than the permittivity of the covering, wherein the second dielectric comprises $LaAlO_3$, wherein the permittivity of the second dielectric is six times larger than the permittivity of the covering, and wherein the covering comprises $SiO_2$.

2. The line component according to claim 1, wherein the line component is formed so as to provide an uneven portion which is substantially perpendicular and/or substantially horizontal to a propagation direction of an electromagnetic wave.

3. The line component according to claim 1, wherein in the line component, sections which are substantially perpendicular and/or substantially horizontal to a propagation direction of an electromagnetic wave are substantially the same.

4. The line component according to claim 1, wherein in a frequency band of an electromagnetic wave generated from a high-frequency source, a characteristic impedance of the line is set so that a peak value of power supply voltage which changes depending on the electromagnetic wave inputted to the line becomes not more than a prescribed value found on the basis of the power supply voltage.

5. A line component which has at least a first dielectric formed in a substantially constant thickness on a semiconductor substrate or a conductor layer and a first conductor formed on the dielectric, wherein a second dielectric having a higher permittivity than silicon oxide is formed on the first conductor, that the first dielectric is formed by specifying the length of the first dielectric relative to the traveling direction of a high-frequency wave traveling in the dielectric to a prescribed length, that a covering of an insulator which covers the line component is provided, and that the second dielectric has a permittivity larger than the permittivity of the covering, wherein the second dielectric comprises $LaAlO_3$, wherein the permittivity of the second dielectric is six times larger than the permittivity of the covering, and wherein the covering comprises $SiO_2$.

6. The line component according to claim 5, wherein an uneven portion is formed at least at one of an interface between the semiconductor substrate or the conductor layer or the first dielectric and an interface between the first dielectric and the first conductor.

7. The line component according to claim 5, wherein the first conductor is further formed in film shape and that a second dielectric is formed in film shape between the conductor and the covering.

8. The line component according to claim 5, in which at least one surface of a top surface, a bottom surface and side surfaces of a first conductor is covered with a third dielectric, wherein the line component is covered with a fourth dielectric, that projections and depressions are formed on a surface of the first conductor, and that the third dielectric is formed so as to provide an uneven portion.

9. The line component according to claim 5, wherein the line component has the semiconductor substrate, the conductor layer and the second conductor, that at least one of the semiconductor substrate, the conductor layer and the second conductor is a ground interconnection or is connected to a ground, and that the first conductor is a power supply interconnection.

10. The line component according to claim 8, wherein the third dielectric is formed by specifying the length of the third dielectric relative to the traveling direction of a high-frequency wave traveling in the dielectric to a prescribed length.

11. The line component according to claim 8, wherein the permittivity of the third dielectric provided on at least one surface of a top surface, a bottom surface and side surfaces of the first conductor is higher than the permittivity of the fourth dielectric.

12. The line component according to claim 9, wherein the conductor layer is polycrystalline silicon.

* * * * *